(12) United States Patent
Baba et al.

(10) Patent No.: US 10,788,545 B2
(45) Date of Patent: Sep. 29, 2020

(54) SENSOR HAVING DEFORMABLE FILM PORTION AND MAGNETIC PORTION AND ELECTRONIC DEVICE

(71) Applicant: Kabushiki Kaisha Toshiba, Tokyo (JP)

(72) Inventors: Shotaro Baba, Kawasaki Kanagawa (JP); Yoshihiko Fuji, Kawasaki Kanagawa (JP); Akiko Yuzawa, Kawasaki Kanagawa (JP); Kei Masunishi, Kawasaki Kanagawa (JP); Michiko Hara, Yokohama Kanagawa (JP); Shiori Kaji, Kawasaki Kanagawa (JP); Tomohiko Nagata, Yokohama Kanagawa (JP); Yoshihiro Higashi, Komatsu Ishikawa (JP); Kazuaki Okamoto, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 313 days.

(21) Appl. No.: 15/896,123

(22) Filed: Feb. 14, 2018

(65) Prior Publication Data

US 2019/0086481 A1   Mar. 21, 2019

(30) Foreign Application Priority Data

Sep. 20, 2017  (JP) ................. 2017-179844

(51) Int. Cl.
*G01R 33/00* (2006.01)
*G01R 1/04* (2006.01)
(Continued)

(52) U.S. Cl.
CPC ........... *G01R 33/0047* (2013.01); *G01R 1/04* (2013.01); *G01R 33/093* (2013.01); *H04R 1/02* (2013.01);
(Continued)

(58) Field of Classification Search
CPC .... G01R 1/04; G01R 33/0047; G01R 33/093; H04R 1/02; H04R 15/00; H04R 21/02;
(Continued)

(56) References Cited

U.S. PATENT DOCUMENTS 5,450,372 A * 9/1995 Jin ........................ H04R 21/02
                                                367/140
6,722,206 B2 * 4/2004 Takada ............... H03H 9/02259
                                                73/777

(Continued)

FOREIGN PATENT DOCUMENTS

JP    2005-147711    6/2005
JP    2008-224486    9/2008
(Continued)

*Primary Examiner* — Steven L Yeninas
(74) *Attorney, Agent, or Firm* — Finnegan, Henderson, Farabow, Garrett & Dunner, L.L.P.

(57) ABSTRACT

According to one embodiment, a sensor includes a supporter, a first film portion, a first sensing element, and a first magnetic portion. The first film portion is supported by the supporter, is deformable, and includes a first fixed end extending along a first fixed end direction. A first sensing element is fixed to the first film portion, and includes a first magnetic layer, a first opposing magnetic layer provided between the first magnetic layer and the first film portion, and a first intermediate layer provided between the first magnetic layer and the first opposing magnetic layer. A direction from the first opposing magnetic layer toward the first magnetic layer is aligned with a first element direction. The first magnetic portion includes a first end portion extending along a first end portion direction tilted with respect to the first fixed end direction, and overlaps a portion of the supporter.

20 Claims, 15 Drawing Sheets

(51) Int. Cl.
*H04R 15/00* (2006.01)
*H04R 1/02* (2006.01)
*G01R 33/09* (2006.01)
*H04R 21/02* (2006.01)

(52) U.S. Cl.
CPC ............. *H04R 15/00* (2013.01); *H04R 21/02* (2013.01); *H04R 2201/003* (2013.01); *H04R 2410/03* (2013.01); *H04R 2499/11* (2013.01)

(58) Field of Classification Search
CPC .......... H04R 2201/003; H04R 2410/03; H04R 2499/11; B81B 2201/0257
USPC ........................................................ 324/262
See application file for complete search history.

(56) References Cited

U.S. PATENT DOCUMENTS

| | | | | |
|---|---|---|---|---|
| 8,351,625 | B2 | 1/2013 | Kasai | |
| 9,841,469 | B2* | 12/2017 | Holm | ................ G01R 33/0005 |
| 9,933,496 | B2* | 4/2018 | Holm | ................ G01R 33/0206 |
| 10,145,907 | B2* | 12/2018 | Holm | .................... G01R 33/09 |
| 10,187,731 | B2* | 1/2019 | Zhou | ...................... H04R 23/00 |
| 2007/0023851 | A1* | 2/2007 | Hartzell | ................. H04R 31/00 257/414 |
| 2008/0116885 | A1* | 5/2008 | Van Zon | .................. G11B 5/39 324/207.21 |
| 2010/0254547 | A1 | 10/2010 | Grosh et al. | |
| 2012/0049298 | A1* | 3/2012 | Schlarmann | ........ B81C 1/00309 257/415 |
| 2014/0090486 | A1* | 4/2014 | Fuji | ....................... G01L 9/0044 73/862.69 |
| 2014/0137668 | A1* | 5/2014 | Fukuzawa | ............. B81B 3/0086 73/862.69 |
| 2014/0369530 | A1* | 12/2014 | Fuji | .................... A61B 5/02141 381/122 |
| 2015/0088008 | A1* | 3/2015 | Fuji | ....................... A61B 5/021 600/485 |
| 2015/0215706 | A1* | 7/2015 | Sparks | ................. B81B 3/0018 381/173 |
| 2015/0350792 | A1 | 12/2015 | Grosh et al. | |
| 2016/0258824 | A1* | 9/2016 | Fuji | ......................... G01B 7/24 |
| 2016/0282101 | A1 | 9/2016 | Kaji et al. | |
| 2018/0210041 | A1 | 7/2018 | Baba et al. | |

FOREIGN PATENT DOCUMENTS

| | | |
|---|---|---|
| JP | 2012-175508 | 9/2012 |
| JP | 5707323 | 3/2015 |
| JP | 2016-180704 | 10/2016 |
| JP | 2017-053729 | 3/2017 |
| JP | 2018-116010 | 7/2018 |

* cited by examiner

US 10,788,545 B2

SENSOR HAVING DEFORMABLE FILM PORTION AND MAGNETIC PORTION AND ELECTRONIC DEVICE

CROSS-REFERENCE TO RELATED APPLICATIONS

This application is based upon and claims the benefit of priority from Japanese Patent Application No. 2017-179844, filed on Sep. 20, 2017; the entire contents of which are incorporated herein by reference.

FIELD

Embodiments described herein relate generally to a sensor and an electronic device.

BACKGROUND

A sensor such as a pressure sensor or the like that uses a magnetic layer has been proposed. For example, the sensor is applied to an electronic device such as a microphone, etc. It is desirable to increase the sensing sensitivity of the sensor.

DETAILED DESCRIPTION

Figure 1A:
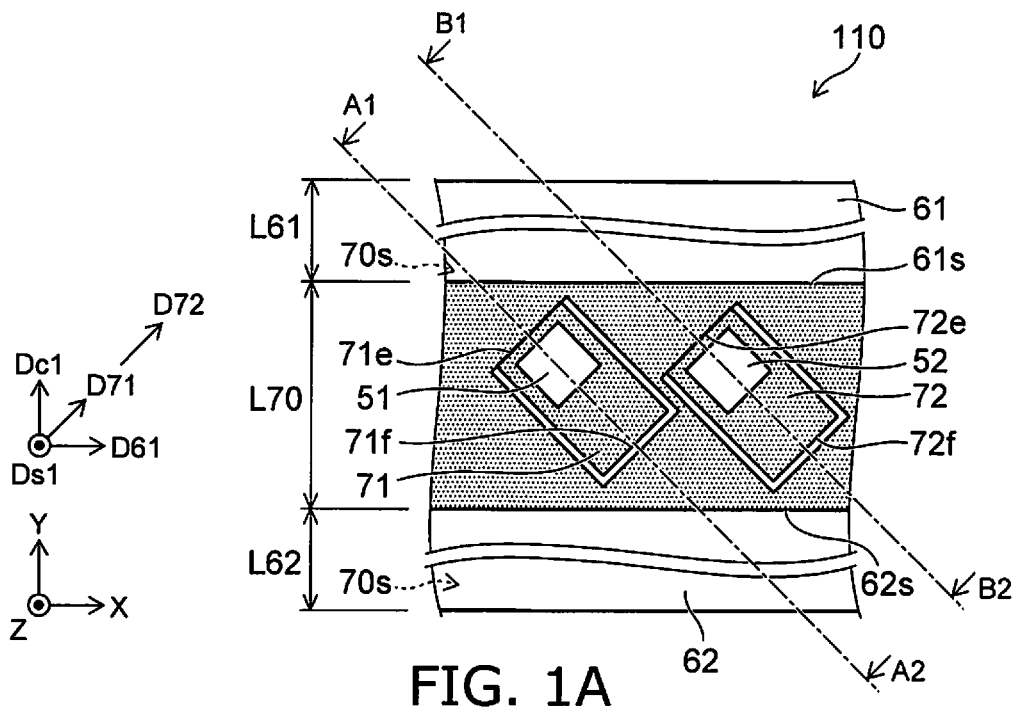
FIG. 1A to FIG. 1C are schematic views illustrating a sensor according to a first embodiment.

According to one embodiment, a sensor includes a supporter, a first film portion, a first sensing element, and a first magnetic portion. The first film portion is supported by the supporter. The first film portion is deformable. The first film portion includes a first fixed end extending along a first fixed end direction. A first sensing element is fixed to the first film portion. The first sensing element includes a first magnetic layer, a first opposing magnetic layer provided between the first magnetic layer and the first film portion, and a first intermediate layer provided between the first magnetic layer and the first opposing magnetic layer. A direction from the first opposing magnetic layer toward the first magnetic layer is aligned with a first element direction. The first magnetic portion includes a first end portion extending along a first end portion direction tilted with respect to the first fixed end direction. The first magnetic portion overlaps a portion of the supporter in the first element direction.

According to another embodiment, an electronic device includes the sensor described above, and a housing.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
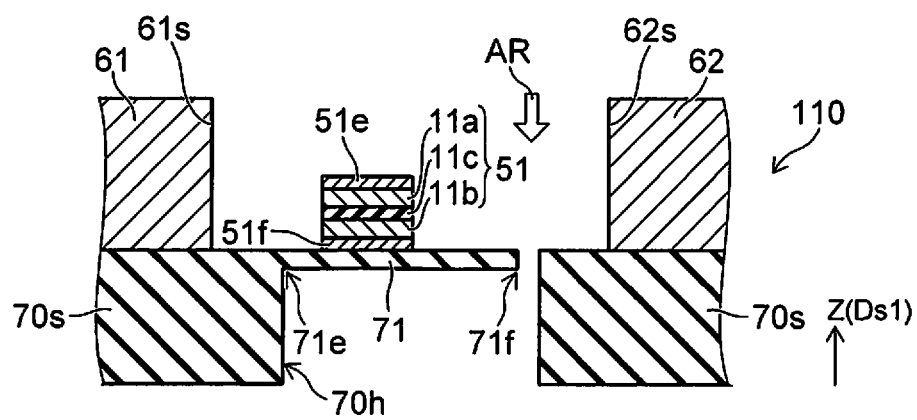
Figure 1C:
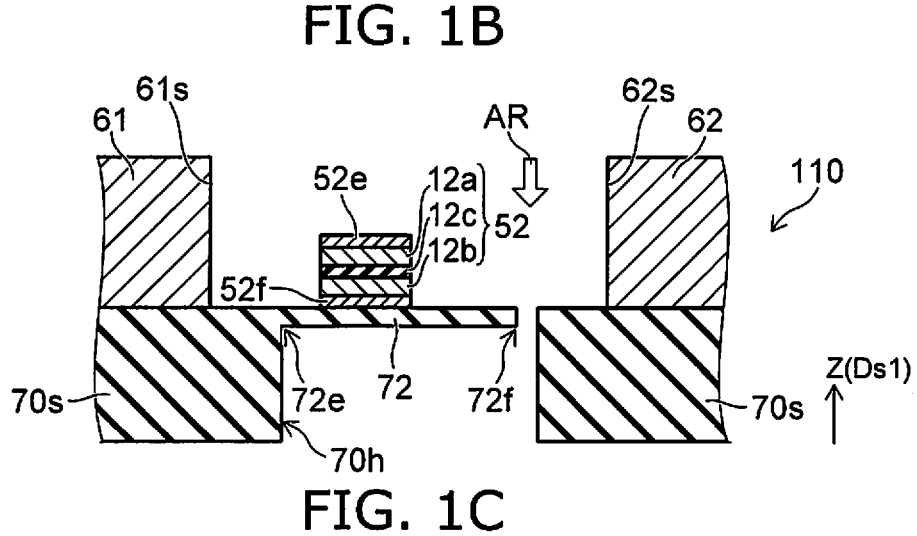

FIG. 1A to FIG. 1C are schematic views illustrating a sensor according to a first embodiment.

FIG. 1A is a plan view as viewed along arrow AR of FIG. 1B and FIG. 1C. FIG. 1B is a line A1-A2 cross-sectional view of FIG. 1A. FIG. 1C is a line B1-B2 cross-sectional view of FIG. 1A.

As shown in FIG. 1A and FIG. 1B, the sensor 110 according to the embodiment includes a supporter 70s, a first film portion 71, a first sensing element 51, and a first magnetic portion 61. A second film portion 72, a second sensing element 52, and a second magnetic portion 62 are further provided in the example.

The first film portion 71 is supported by the supporter 70s. The first film portion 71 is deformable. The first film portion 71 includes a first fixed end 71e. The first fixed end 71e is connected to the supporter 70s. The first fixed end 71e extends along a first fixed end direction D71.

The first sensing element 51 is fixed to the first film portion 71.

As shown in FIG. 1B, the first sensing element 51 includes a first magnetic layer 11a, a first opposing magnetic layer 11b, and a first intermediate layer 11c. The first opposing magnetic layer 11b is provided between the first magnetic layer 11a and the first film portion 71. The first intermediate layer 11c is provided between the first magnetic layer 11a and the first opposing magnetic layer 11b. The first intermediate layer 11c is nonmagnetic.

The direction from the first opposing magnetic layer 11b toward the first magnetic layer 11a is aligned with a first element direction Ds1. The first element direction Ds1 corresponds to the stacking direction of these magnetic layers.

The first element direction Ds1 is taken as a Z-axis direction. One direction perpendicular to the Z-axis direction is taken as an X-axis direction. A direction perpendicular to the Z-axis direction and the X-axis direction is taken as a Y-axis direction.

As shown in FIG. 1B, the first magnetic portion 61 overlaps a portion of the supporter 70s in the first element direction Ds1 (the Z-axis direction).

As shown in FIG. 1A, the first magnetic portion 61 includes a first end portion 61s. The first end portion 61s extends along a first end portion direction D61. The first end portion direction D61 is tilted with respect to the first fixed end direction D71.

In the example, the first end portion direction D61 is aligned with the X-axis direction. The first end portion direction D61 is substantially perpendicular to the Z-axis direction. On the other hand, the first fixed end direction D71 is tilted with respect to the X-axis direction. The first fixed end direction D71 is substantially perpendicular to the Z-axis direction.

The angle between the first end portion direction D61 and the first fixed end direction D71 is greater than 0 degrees but less than 90 degrees. This angle may be, for example, not less than 10 degrees and not more than 80 degrees. This angle may be, for example, not less than 20 degrees and not more than 70 degrees. This angle may be, for example, not less than 30 degrees and not more than 60 degrees.

In the example, the first film portion 71 has a "cantilever beam" structure. The first film portion 71 further includes a first film portion end 71f. The direction from the first fixed end 71e toward the first film portion end 71f crosses the first fixed end direction D71. The first film portion end 71f is a free end. The first film portion end 71f is displaceable along the first element direction Ds1 (the Z-axis direction).

For example, a direction crossing a plane (the X-Z plane) including the first end portion direction D61 (e.g., the X-axis direction) and the first element direction Ds1 (e.g., the Z-axis direction) is taken as a first cross direction Dc1. The first cross direction Dc1 is, for example, the Y-axis direction. The position of the first fixed end 71e in the first cross direction Dc1 is between the position of the first end portion 61s in the first cross direction Dc1 and the position of the first film portion end 71f in the first cross direction Dc1.

The position of the first sensing element 51 in the first cross direction Dc1 is between the position of the first end portion 61s in the first cross direction Dc1 and the position of the first film portion end 71f in the first cross direction Dc1.

For example, the first film portion 71 deforms when a force is applied to the first film portion 71. In the example, the first film portion end 71f is displaced along the Z-axis direction. A strain that corresponds to the displacement is generated in the first sensing element 51. Thereby, the electrical resistance of the first sensing element 51 changes.

The force can be sensed by sensing the change of the electrical resistance. The force is, for example, pressure or sound pressure.

As shown in FIG. 1B, a first conductive layer 51e and a first opposing conductive layer 51f are provided in the example. The first magnetic layer 11a, the first opposing magnetic layer 11b, and the first intermediate layer 11c are provided between these conductive layers. The electrical resistance between these conductive layers is sensed. Thereby, the force is sensed.

On the other hand, as shown in FIG. 1A and FIG. 1C, the second film portion 72 is supported by the supporter 70s. The second film portion 72 also is deformable. The second film portion 72 includes a second fixed end 72e. The second fixed end 72e is connected to the supporter 70s. The second fixed end 72e extends along a second fixed end direction D72. The second fixed end direction D72 is tilted with respect to the first end portion direction D61. The second film portion 72 further includes a second film portion end 72f. The direction from the second fixed end 72e toward the second film portion end 72f crosses the second fixed end direction D72. In the example, the second film portion end 72f is a free end. The second film portion end 72f is displaceable along the Z-axis direction.

In the example, the second fixed end direction D72 is aligned with the first fixed end direction D71. For example, the angle between the second fixed end direction D72 and the first fixed end direction D71 may be, for example, 10 degrees or less. For example, the second fixed end direction D72 may be substantially parallel to the first fixed end direction D71. By the second fixed end direction D72 being aligned with the first fixed end direction D71, for example, the orientations of the strains generated according to the displacement of the film portions can be the same orientation. The distance between these film portions can be shortened. It is easy to downsize the sensor.

The second sensing element 52 is fixed to the second film portion 72. The second sensing element 52 includes a second magnetic layer 12a, a second opposing magnetic layer 12b, and a second intermediate layer 12c. The second opposing magnetic layer 12b is provided between the second magnetic layer 12a and the second film portion 72. The second intermediate layer 12c is provided between the second magnetic layer 12a and the second opposing magnetic layer 12b. The second intermediate layer 12c is nonmagnetic. A second conductive layer 52e and a second opposing conductive layer 52f are provided. The second magnetic layer 12a, the second opposing magnetic layer 12b, and the second intermediate layer 12c are provided between these conductive layers.

Thus, multiple film portions and multiple sensing elements may be provided in the sensor 110.

For example, the first sensing element 51 may be electrically connected in series with the second sensing element 52. By being connected in series, for example, the SN ratio improves.

In the example as shown in FIG. 1A, for example, the direction from the first sensing element 51 toward the second sensing element 52 is aligned with the first end portion direction D61 (e.g., the X-axis direction). The direction from the first fixed end 71e toward the second fixed end 72e is aligned with the first end portion direction D61.

The second magnetic portion 62 is further provided in the example. As shown in FIG. 1B and FIG. 1C, the second magnetic portion 62 overlaps another portion of the supporter 70s in the first element direction Ds1 (the Z-axis direction). At least a portion of the first sensing element 51 is positioned between the first magnetic portion 61 and the second magnetic portion 62. At least a portion of the second sensing element 52 is positioned between the first magnetic portion 61 and the second magnetic portion 62. The second magnetic portion 62 includes a second end portion 62s. The second end portion 62s extends along the first end portion direction D61.

As described below, a magnetic field is generated from the first magnetic portion 61 (and the second magnetic portion 62). By applying the magnetic field to the sensing elements, the magnetizations of the magnetic layers included in the sensing elements can be oriented in the desired direction. Thereby, good characteristics can be obtained in the sensing of the force applied to the sensing elements (the film portions). For example, the change of the electrical resistance corresponding to the force applied to the sensing elements (the film portions) can be large.

In the embodiment, for example, the second magnetic portion 62 may be omitted in the case where the magnetic field generated from the first magnetic portion 61 is applied effectively to the sensing elements. By providing the second magnetic portion 62 in addition to the first magnetic portion 61, it is easy to apply an effective magnetic field to the sensing elements.

At least one of the first magnetic portion 61 or the second magnetic portion 62 includes, for example, at least one selected from the group consisting of Co, Fe, and Ni. At least one of the first magnetic portion 61 or the second magnetic portion 62 includes, for example, at least one of Co—Pt, Fe—Pt, Co—Pd, or Fe—Pd. For example, the magnetic anisotropy and the coercivity are relatively high for these materials. These materials are, for example, hard magnetic materials. At least one of the first magnetic portion 61 or the second magnetic portion 62 may include, for example, an alloy. The alloy includes an added element and at least one of Co—Pt, Fe—Pt, Co—Pd, or Fe—Pd. At least one of the first magnetic portion 61 or the second magnetic portion 62 includes, for example, CoPt (the proportion of Co being not less than 50 at. % and not more than 85 at. %), $(Co_xPt_{100-x})_{100-y}Cr_y$ (x being not less than 50 at. % and not more than 85 at. %, and y being not less than 0 at. % and not more than 40 at. %), FePt (the proportion of Pt being not less than 40 at. % and not more than 60 at. %), etc. The first magnetic portion 61 and the second magnetic portion 62 are, for example, hard bias portions.

At least one of the first magnetic portion 61 or the second magnetic portion 62 may have a structure of being stacked with a not-illustrated hard bias-layer pinning layer. In such a case, the directions of the magnetizations of these magnetic portions can be set (fixed) by the exchange coupling between the hard bias-layer pinning layer and these magnetic portions. In such a case, these magnetic portions include a ferromagnetic material of at least one of Fe, Co, or Ni, or an alloy including at least one type of these elements. In such a case, these magnetic portions include, for example, a $Co_xFe_{100-x}$ alloy (x being not less than 0 at. % and not more than 100 at. %), a $Ni_xFe_{100-x}$ alloy (x being not less than 0 at. % and not more than 100 at. %), or a material in which a nonmagnetic element is added to these alloys. These magnetic portions include, for example, a material similar to the first opposing magnetic layer 11b. The hard bias-layer pinning layer includes a material similar to a pinning layer 206 described below. In the case where the hard bias-layer pinning layer is provided, a foundation layer similar to a material included in a foundation layer 205 described below may be provided under the hard bias-layer pinning layer. The hard bias-layer pinning layer may be provided at a lower portion or an upper portion of the hard bias layer. In such a case, the magnetization direction of at least one of the first magnetic portion 61 or the second magnetic portion 62 may be determined by heat treatment in a magnetic field similarly to the pinning layer 206.

At least one of the first magnetic portion 61 or the second magnetic portion 62 may include, for example, at least one of alnico, ferrite, neodymium, samarium-cobalt, or the like. These materials are, for example, bulk permanent magnet materials.

The supporter 70s may include, for example, a substrate having a plate configuration. For example, a hollow portion 70h is provided in the interior of the substrate.

The supporter 70s may include, for example, a semiconductor material such as silicon, etc., a conductive material such as a metal, etc., or an insulating material. The supporter 70s may include, for example, silicon oxide, silicon nitride, etc. For example, the interior of the hollow portion 70h is in a reduced-pressure state (a vacuum state). A liquid or a gas such as air, etc., may be filled into the interior of the hollow portion 70h. The interior of the hollow portion 70h is designed so that the film portions (the first film portion 71, etc.) can flex. The interior of the hollow portion 70h may communicate with outside ambient air.

The film portions (the first film portion 71, etc.) are provided on the hollow portion 70h. For example, a portion of the substrate that is used to form the supporter 70s is patterned to be thin and is included in the film portions. The thicknesses (the lengths in the Z-axis direction) of the film portions are thinner than the thickness (the length in the Z-axis direction) of the substrate.

The film portions (the first film portion 71, etc.) flex when a pressure is applied to the film portions. The pressure corresponds to the pressure to be sensed by the pressure sensor 110. The pressure that is applied also includes pressure due to a sound wave or an ultrasonic wave. In the case where pressure due to a sound wave, an ultrasonic wave, or the like is sensed, the pressure sensor 110 functions as a microphone.

The film portions (the first film portion 71, etc.) include, for example, insulating materials. The film portions include, for example, at least one of silicon oxide, silicon nitride, silicon oxynitride, or aluminum oxide. The film portions may include, for example, a semiconductor material such as silicon, etc. The film portions may include, for example, metal materials.

The thicknesses of the film portions (the first film portion 71, etc.) are, for example, not less than 0.1 micrometers (μm) and not more than 3 μm. It is favorable for the thicknesses to be not less than 0.2 μm and not more than 1.5 μm. The film portions may include, for example, a stacked body of a silicon oxide film having a thickness of 0.2 μm and a silicon film having a thickness of 0.4 μm. The film portion may include, for example, a stacked body of a silicon nitride film having a thickness of 0.4 μm and an aluminum oxide film having a thickness of 0.05 μm.

An example of an operation of the sensor 110 will now be described.

Figure 2:
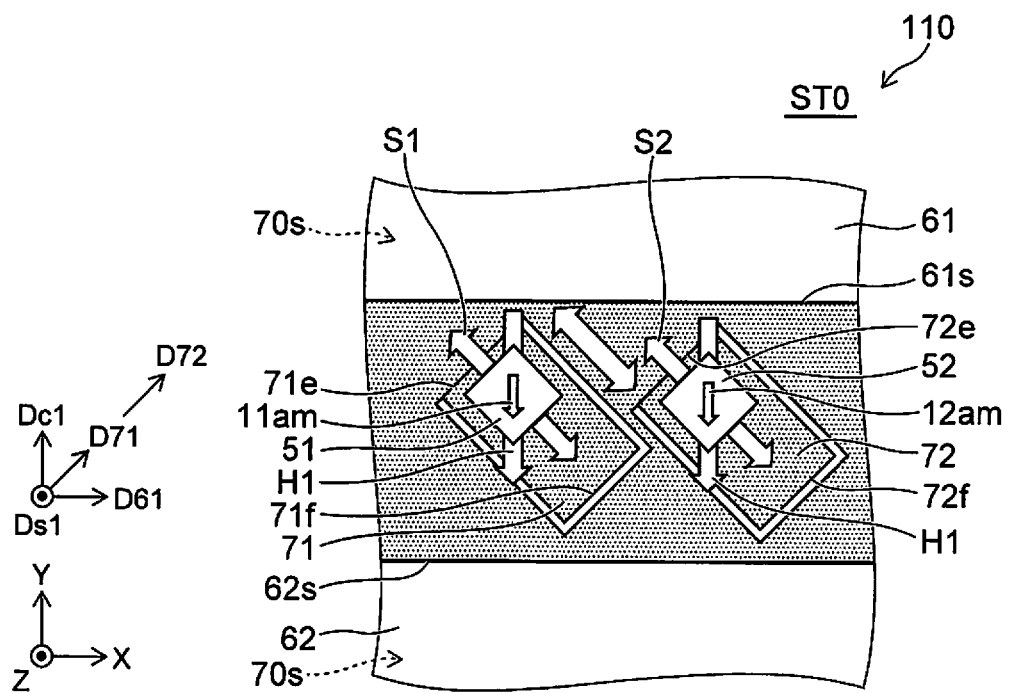
FIG. 2 is a schematic view illustrating the operation of the sensor according to the first embodiment.

FIG. 2 is a schematic view illustrating the operation of the sensor according to the first embodiment.

FIG. 2 corresponds to a state ST0 in which a force is not applied to the film portion (e.g., the first film portion 71). As shown in FIG. 2, a bias magnetic field H1 is generated from the first magnetic portion 61. The bias magnetic field H1 is aligned with the Y-axis direction (a direction crossing the first end portion direction D61). The magnetization (in the example, a magnetization 11am) of the magnetic layer included in the first sensing element 51 and the magnetization (in the example, a magnetization 12am) of the magnetic layer included in the second sensing element 52 are aligned with the bias magnetic field H1.

The first film portion 71 deforms when a force is applied to the first film portion 71. Thereby, a strain S1 is generated in the first sensing element 51. A strain S2 is generated in the second sensing element 52 as well. The direction of the strain S1 and the direction of the strain S2 are aligned with a direction perpendicular to the first fixed end direction D71.

The directions of the magnetizations of the magnetic layers change due to these strains changing according to the force. Thereby, the electrical resistances change.

Figure 3A:
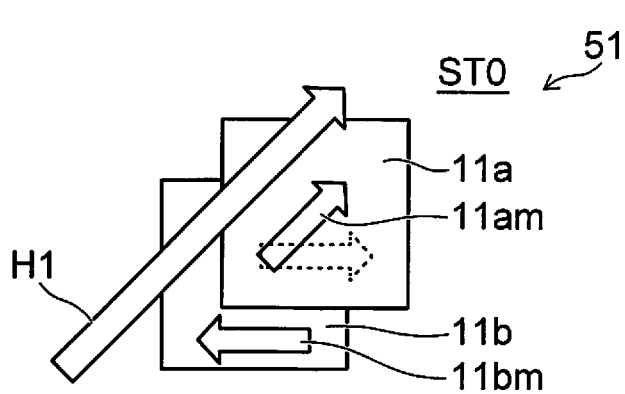
FIG. 3A to FIG. 3C are schematic views illustrating operations of the sensor according to the first embodiment.
Figures 3B, 3C:
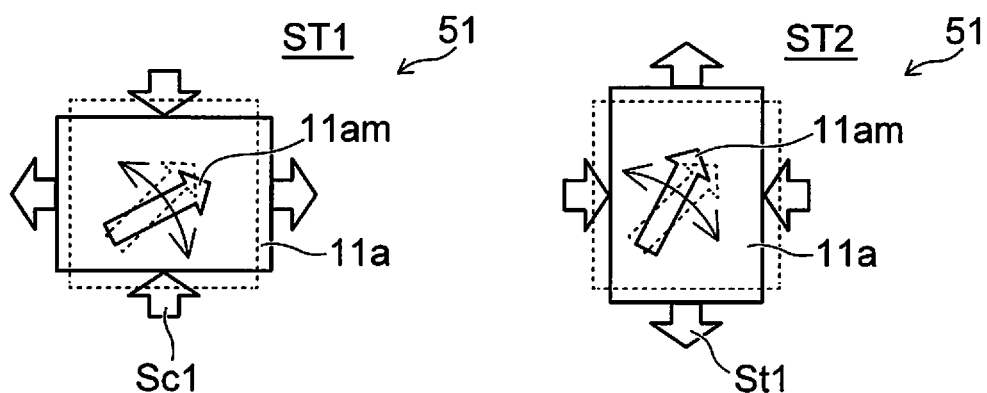

FIG. 3A to FIG. 3C are schematic views illustrating operations of the sensor according to the first embodiment.

FIG. 3A corresponds to the state ST0 in which the force is not applied to the film portion (e.g., the first film portion 71). In the state ST0, for example, the strain is not generated in the sensing element. FIG. 3B corresponds to a state ST1 in which a force is applied to the film portion (e.g., the first film portion 71) and stress is applied to the sensing element. FIG. 3C corresponds to a state ST2 in which another force is applied to the film portion (e.g., the first film portion 71) and another stress is applied to the sensing element.

The first sensing element 51 will be described as the sensing element in the example. In the example, the direction of the magnetization of the first magnetic layer 11a changes easily compared to the direction of the magnetization of the first opposing magnetic layer 11b. The first opposing magnetic layer 11b corresponds to, for example, a reference layer (e.g., a fixed magnetic layer). For example, the first magnetic layer 11a corresponds to a free layer (e.g., a free magnetic layer). In the embodiment, the first opposing magnetic layer 11b may be a free layer; and the first magnetic layer 11a may be a reference layer.

As shown in FIG. 3A, a magnetization 11bm of the first opposing magnetic layer 11b is fixed along one direction. On the other hand, in the state ST0, the magnetization 11am of the first magnetic layer 11a is aligned with the bias magnetic field H1 from the first magnetic portion 61.

In the state ST1 as shown in FIG. 3B, a compressive strain Sc1 is generated in the first sensing element 51. Thereby, the direction of the magnetization 11am of the first magnetic layer 11a changes (rotates).

In the state ST2 as shown in FIG. 3C, a tensile strain St1 is generated in the first sensing element 51. Thereby, the direction of the magnetization 11am of the first magnetic layer 11a changes (rotates).

For example, the rotation direction of the magnetization 11am in the state ST1 is the reverse of the rotation direction of the magnetization 11am in the state ST2. The angle between the magnetization 11am and the magnetization 11bm in the state ST1 is different from the angle between the magnetization 11am and the magnetization 11bm in the state ST2. This difference of the angles causes the change of the electrical resistance.

In the case where the length along the first end portion direction D61 of the first end portion 61s of the first magnetic portion 61 is sufficiently long, the bias magnetic field H1 that is generated from the first magnetic portion 61 is perpendicular to the first end portion direction D61. In the state ST0, the magnetization 11am of the first magnetic layer 11a is aligned with a direction perpendicular to the first end portion direction D61 (referring to FIG. 2).

On the other hand, as shown in FIG. 3A, the first fixed end direction D71 of the first fixed end 71e of the first film portion 71 is tilted with respect to the first end portion direction D61. Therefore, the direction of the strain S1 generated according to the deformation of the first film portion 71 (referring to FIG. 2) also is tilted with respect to the first end portion direction D61. The direction of the strain S1 is tilted with respect to the direction of the magnetization 11am. Thereby, the magnetization 11am rotates easily when the force is applied to the first film portion 71. Therefore, an electrical resistance corresponding to the magnitude of the applied force (strain) is obtained. For example, sensing that has high linearity can be performed. The magnetization 11bm of the first opposing magnetic layer 11b may be tilted with respect to the first fixed end direction D71. The angle between the magnetization 11bm and the first fixed end direction D71 may be, for example, not less than 0 degrees and not more than 10 degrees. For example, the magnetization 11bm of the first opposing magnetic layer 11b may be fixed in the first fixed end direction D71.

For example, a first reference example is considered in which the first end portion direction D61 is parallel or perpendicular to the first fixed end direction D71. In such a case, the direction of the strain S1 is parallel or perpendicular to the direction of the magnetization 11am. In such a first reference example, the magnetization 11am does not rotate easily when the strain S1 is generated. In the first reference example, for example, the linearity of the sensing is low. For example, the increase of the sensing sensitivity is difficult.

Conversely, in the embodiment, the sensing sensitivity can be increased because the magnetization 11am rotates easily when the force is applied to the first film portion 71.

In the embodiment, the magnetic portions (the first magnetic portion 61, the second magnetic portion 62, etc.) are provided at the supporter 70s. On the other hand, a second reference example is considered in which the magnetic portion is provided on the film portion. In the second reference example, the film portion does not deform easily because the magnetic portion is provided in the film portion. Therefore, there are cases where the increase of the sensitivity of the sensing is insufficient.

Conversely, in the embodiment, the magnetic portions (the first magnetic portion 61, the second magnetic portion 62, etc.) are provided at the supporter 70s. Thereby, the high deformability of the film portions can be maintained. For example, a uniform bias magnetic field H1 is obtained by setting the size (or the volume) of the magnetic portions to be large. Because the magnetic portions are provided at the supporter 70s, the high deformability of the film portions can be maintained even in the case where the size (or the volume) is set to be large.

For example, the first magnetic portion 61 and the second magnetic portion 62 are provided at different locations of the supporter 70s; and the film portions (e.g., the first film portion 71, the second film portion 72, etc.) are provided between the first magnetic portion 61 and the second magnetic portion 62. Thereby, a stable bias magnetic field H1 is obtained by the first magnetic portion 61 and the second magnetic portion 62 while maintaining the high deformabilities of the film portions.

Multiple sensing elements (the first sensing element 51, the second sensing element 52, etc.) are provided in the sensor 110. As described above, the direction from the first sensing element 51 toward the second sensing element 52 is aligned with the first end portion direction D61 (e.g., the X-axis direction) (referring to FIG. 1A). By arranging the multiple sensing elements along the X-axis direction, it is easy to downsize the sensor.

For example, the distance from the first magnetic portion 61 to the first sensing element 51 is substantially the same as the distance from the first magnetic portion 61 to the second sensing element 52.

For example, the distance between the first sensing element 51 and the first end portion 61s along a direction (e.g., the Y-axis direction) perpendicular to a plane (the X-Z plane) including the first end portion direction D61 and the first element direction Ds1 is not less than 0.8 times and not more than 1.2 times the distance between the second sensing element 52 and the first end portion 61s along the perpendicular direction (e.g., the Y-axis direction). For example, the distance between the first end portion 61s and the first sensing element 51 is substantially the same as the distance between the first end portion 61s and the second sensing element 52. Thereby, bias magnetic fields H1 of substantially the same strength are applied to these sensing elements.

In the embodiment, a distance L70 along the Y-axis direction between the first magnetic portion 61 and the second magnetic portion 62 (referring to FIG. 1A) is, for example, not less than 50 μm and not more than 2000 μm. A length L61 along the Y-axis direction of the first magnetic portion 61 (referring to FIG. 1A) is, for example, not less than 100 μm and not more than 1000 μm. A length L62 along the Y-axis direction of the second magnetic portion 62 (referring to FIG. 1A) is, for example, not less than 100 μm and not more than 1000 μm. In the embodiment, these distances and lengths are arbitrary.

In the sensor 110, slits are provided around the first film portion 71 and the second film portion 72. The slits define the configurations of these film portions.

Figure 4:
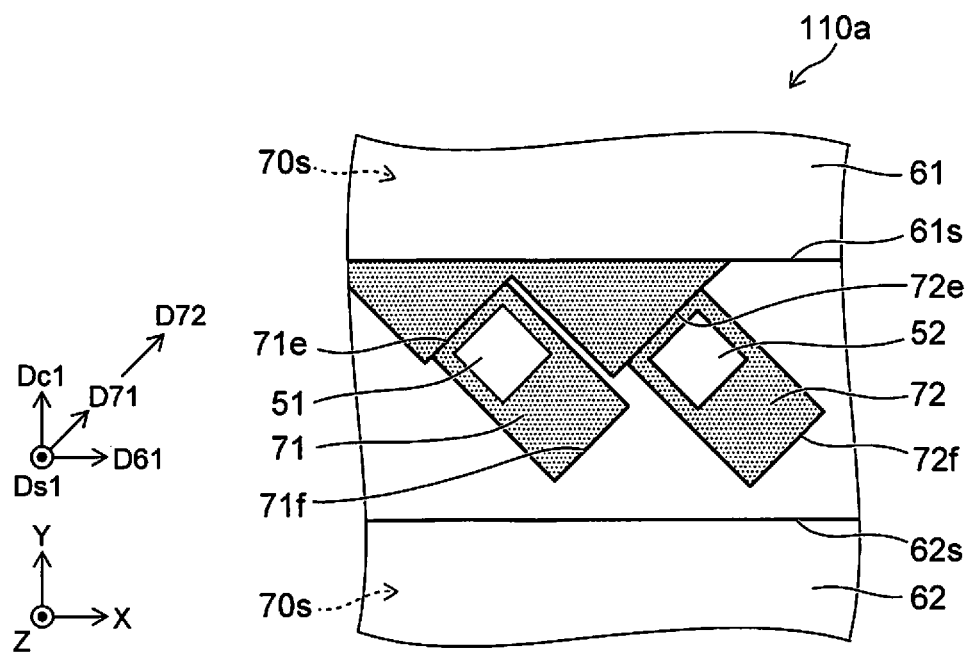
FIG. 4 is a schematic plan view illustrating another sensor according to the first embodiment.

FIG. 4 is a schematic plan view illustrating another sensor according to the first embodiment.

FIG. 4 is a plan view corresponding to FIG. 1A. In the sensor 110a as shown in FIG. 4, the entire periphery of the first film portion 71 and the second film portion 72 is a space. In the embodiment, the configurations of the film portions and the configuration of the periphery of the film portions are arbitrary.

Figure 5:
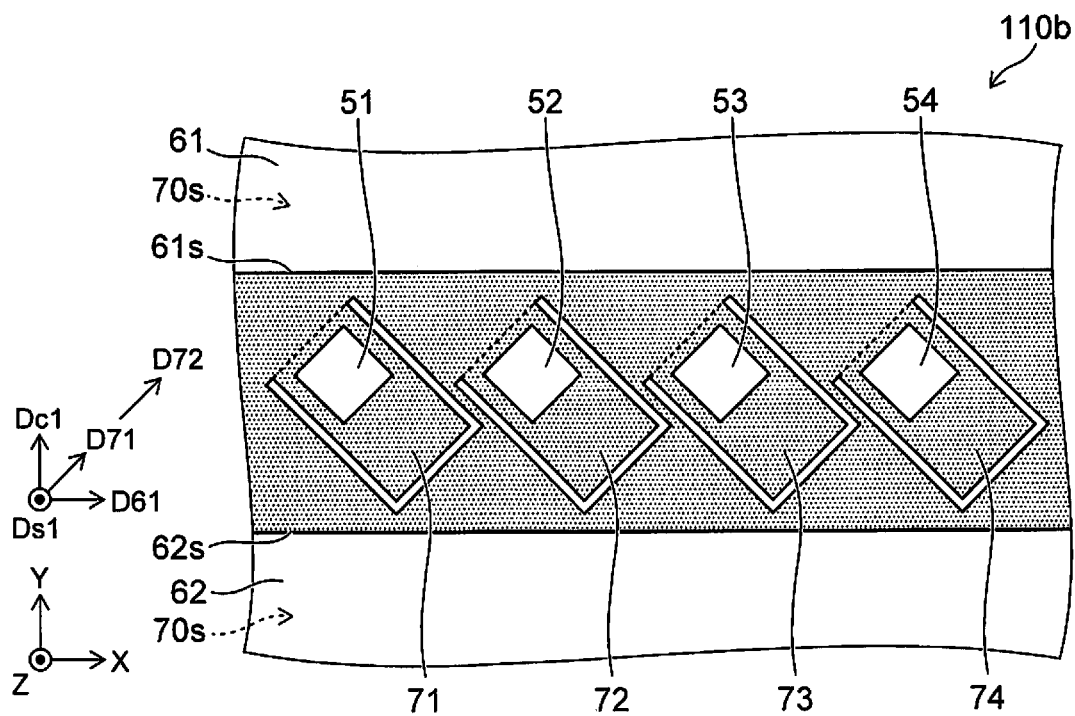
FIG. 5 is a schematic plan view illustrating another sensor according to the first embodiment.

FIG. 5 is a schematic plan view illustrating another sensor according to the first embodiment.

FIG. 5 is a plan view corresponding to FIG. 1A. In the sensor 110b as shown in FIG. 5, a third film portion 73 and a fourth film portion 74 are provided in addition to the first film portion 71 and the second film portion 72. These film portions are arranged along the first end portion direction D61. A third sensing element 53 and a fourth sensing element 54 are further provided in addition to the first sensing element 51 and the second sensing element 52. The third sensing element 53 is provided at the third film portion 73. The fourth sensing element 54 is provided at the fourth film portion 74. For example, the configurations of the third sensing element 53 and the fourth sensing element 54 are similar to the configuration of the first sensing element 51 (or the configuration of the second sensing element 52). The number of sensing elements in the sensor 110b according to the embodiment is arbitrary. For example, these sensing elements may be electrically connected in series.

Figure 6A:
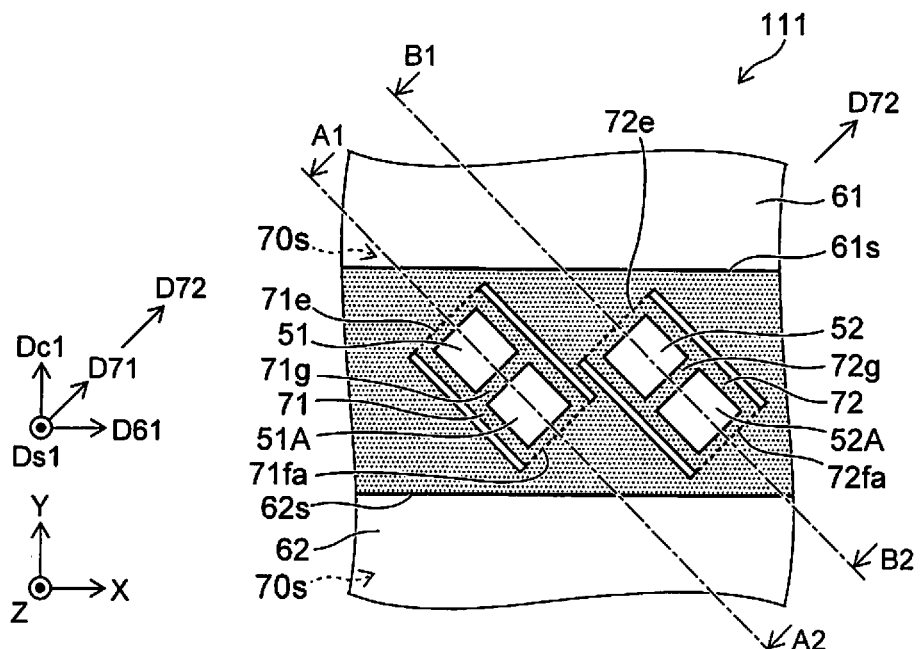
FIG. 6A to FIG. 6C are schematic views illustrating another sensor according to the first embodiment.
Figure 6B:
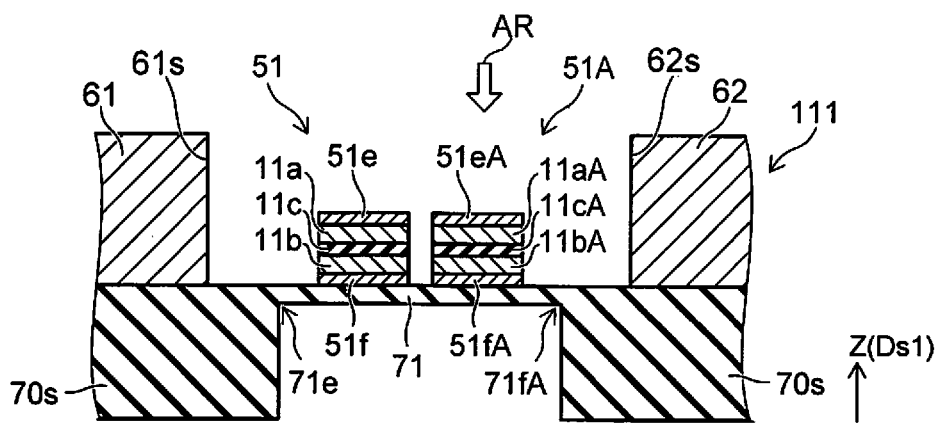
Figure 6C:
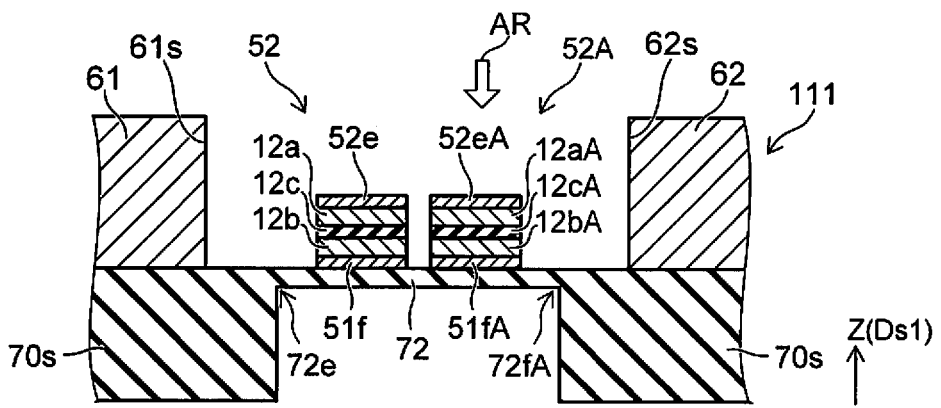

FIG. 6A to FIG. 6C are schematic views illustrating another sensor according to the first embodiment. FIG. 6A is a plan view as viewed along arrow AR of FIG. 6B and FIG. 6C. FIG. 6B is a line A1-A2 cross-sectional view of FIG. 6A. FIG. 6C is a line B1-B2 cross-sectional view of FIG. 6A.

The supporter 70s, the first film portion 71, the first sensing element 51, and the first magnetic portion 61 are provided in the sensor 111 according to the embodiment as well. The second film portion 72, the second sensing element 52, and the second magnetic portion 62 are further provided in the example. The supporter 70s, the first magnetic portion 61, and the second magnetic portion 62 of the sensor 111 are similar to those of the sensor 110.

As shown in FIG. 6A, the first film portion 71 further includes a first film portion end 71fa and a first inner portion 71g in addition to the first fixed end 71e. The direction from the first fixed end 71e toward the first film portion end 71fa crosses the first fixed end direction D71. The first inner portion 71g is positioned between the first fixed end 71e and the first film portion end 71fa in the direction from the first fixed end 71e toward the first film portion end 71fa.

In the sensor 111, the first film portion 71 has a "fixed beam" configuration. The first fixed end 71e and the first film portion end 71fa are fixed to the supporter 70s. The first inner portion 71g is displaceable in the first element direction Ds1 (e.g., the Z-axis direction).

Similarly, the second film portion 72 further includes a second film portion end 72fa and a second inner portion 72g in addition to the second fixed end 72e. The direction from the second fixed end 72e toward the second film portion end 72fa crosses the second fixed end direction D72. The second inner portion 72g is positioned between the second fixed end 72e and the second film portion end 72fa in the direction from the second fixed end 72e toward the second film portion end 72fa. In the example, the second fixed end direction D72 is substantially parallel to the first fixed end direction D71. The second fixed end 72e and the second film portion end 72fa are fixed to the supporter 70s. The second inner portion 72g is displaceable in the first element direction Ds1 (e.g., the Z-axis direction).

In the sensor 111, a first film portion end sensing element 51A and a second film portion end sensing element 52A are further provided in addition to the first sensing element 51 and the second sensing element 52. One of the first film portion end sensing element 51A or the second film portion end sensing element 52A may be electrically connected in series with, for example, at least one of the first sensing element 51 or the second sensing element 52.

The first film portion end sensing element 51A is fixed to the first film portion 71. The distance between the first film portion end sensing element 51A and the first fixed end 71e is longer than the distance between the first film portion end sensing element 51A and the first film portion end 71fa. The distance between the first sensing element 51 and the first fixed end 71e is shorter than the distance between the first sensing element 51 and the first film portion end 71fa.

The second film portion end sensing element 52A is fixed to the second film portion 72. The distance between the second film portion end sensing element 52A and the second fixed end 72e is longer than the distance between the second film portion end sensing element 52A and the second film portion end 72fa. The distance between the second sensing element 52 and the second fixed end 72e is shorter than the distance between the second sensing element 52 and the second film portion end 72fa.

As shown in FIG. 6B, the first film portion end sensing element 51A includes a first film portion end magnetic layer 11aA, a first opposing film portion end magnetic layer 11bA, and a first film portion end intermediate layer 11cA. The first opposing film portion end magnetic layer 11bA is provided between the first film portion end magnetic layer 11aA and the first film portion 71. The first film portion end intermediate layer 11cA is provided between the first film portion end magnetic layer 11aA and the first opposing film portion end magnetic layer 11bA. A conductive layer 51eA and a conductive layer 51fA are provided. The first film portion end magnetic layer 11aA, the first opposing film portion end magnetic layer 11bA, and the first film portion end intermediate layer 11cA are provided between these conductive layers.

As shown in FIG. 6C, the second film portion end sensing element 52A includes a second film portion end magnetic layer 12aA, a second opposing film portion end magnetic layer 12bA, and a second film portion end intermediate layer 12cA. The second opposing film portion end magnetic layer 12bA is provided between the second film portion end magnetic layer 12aA and the second film portion 72. The second film portion end intermediate layer 12cA is provided between the second film portion end magnetic layer 12aA and the second opposing film portion end magnetic layer 12bA. A conductive layer 52eA and a conductive layer 52fA are provided. The second film portion end magnetic layer 12aA, the second opposing film portion end magnetic layer 12bA, and the second film portion end intermediate layer 12cA are provided between these conductive layers.

Figure 7:
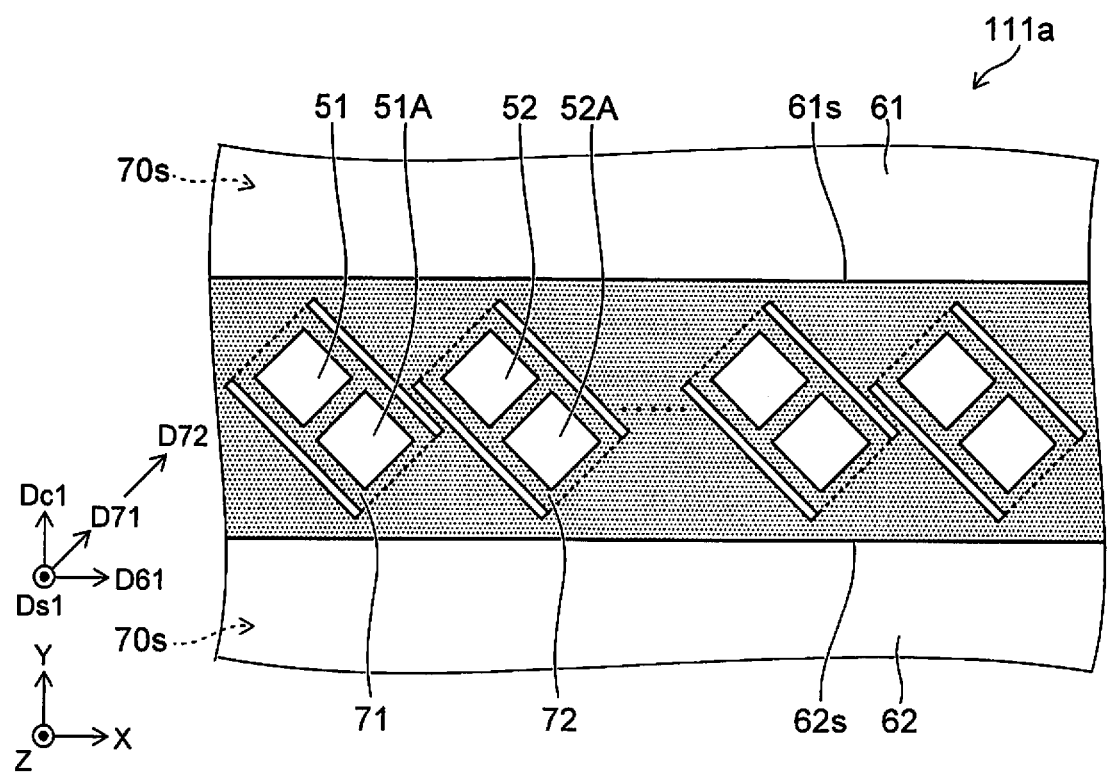
FIG. 7 is a schematic plan view illustrating another sensor according to the first embodiment.

FIG. 7 is a schematic plan view illustrating another sensor according to the first embodiment.

FIG. 7 is a plan view corresponding to FIG. 6A.

As shown in FIG. 7, multiple film portions (e.g., the first film portion 71, the second film portion 72, etc.) are provided in the sensor 111a. The multiple film portions each have "fixed beam" configurations. The number of multiple film portions may be three, four, or more. Sensing elements are provided at each of the multiple film portions. The sensing elements that are provided at the multiple film portions may be electrically connected in series to each other.

Figure 8A:
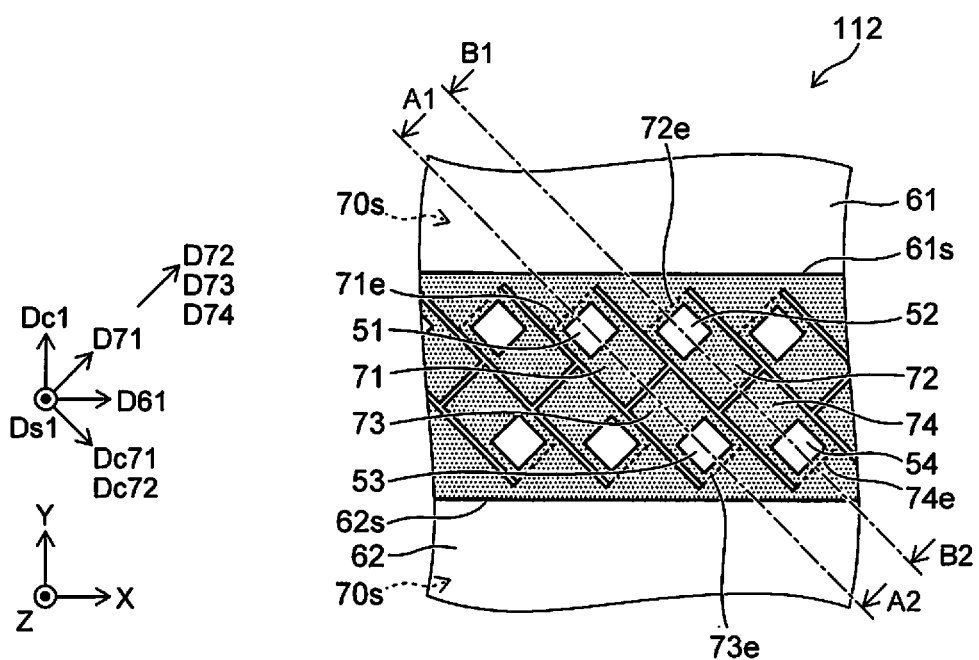
FIG. 8A to FIG. 8C are schematic views illustrating another sensor according to the first embodiment.
Figure 8B:
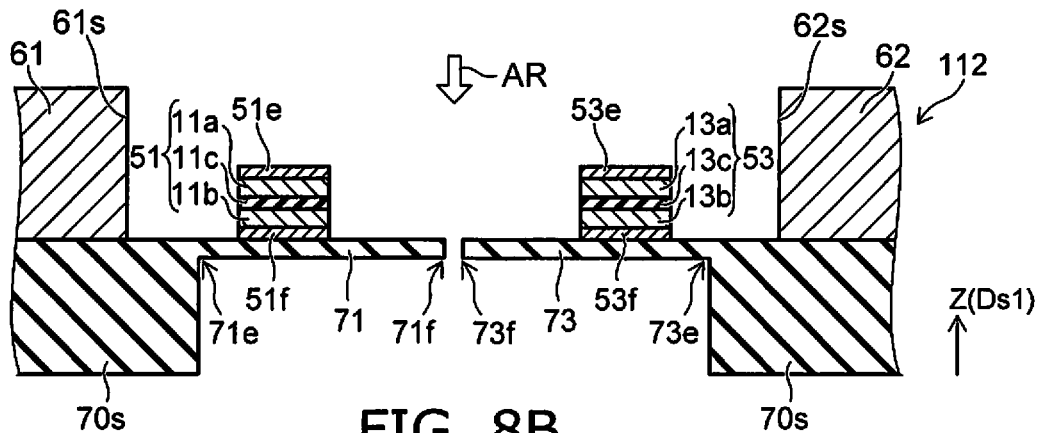
Figure 8C:
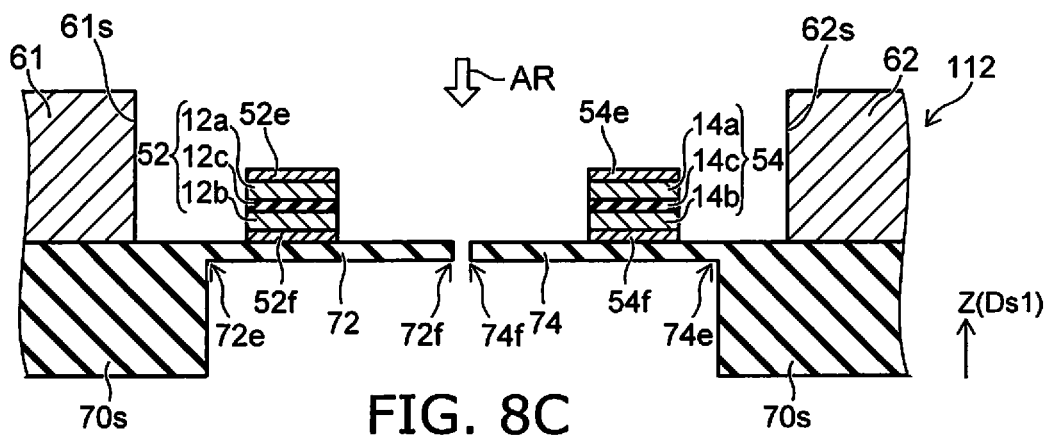

FIG. 8A to FIG. 8C are schematic views illustrating another sensor according to the first embodiment. FIG. 8A is a plan view as viewed along arrow AR of FIG. 8B and FIG. 8C. FIG. 8B is a line A1-A2 cross-sectional view of FIG. 8A. FIG. 8C is a line B1-B2 cross-sectional view of FIG. 8A.

The supporter 70s, the first film portion 71, the first sensing element 51, the first magnetic portion 61, and the second magnetic portion 62 are provided in the sensor 112 according to the embodiment as well. The second film portion 72, the third film portion 73, the fourth film portion 74, the second sensing element 52, the third sensing element 53, and the fourth sensing element 54 are further provided in the example. The supporter 70s, the first magnetic portion 61, and the second magnetic portion 62 of the sensor 112 are similar to those of the sensor 110. The first film portion 71, the second film portion 72, the first sensing element 51, and the second sensing element 52 of the sensor 112 are similar to those of the sensor 110.

The third film portion 73 is supported by the supporter 70s. The third film portion 73 is deformable. The third film portion 73 includes a third fixed end 73e. The third fixed end 73e extends along a third fixed end direction D73. The third fixed end direction D73 is tilted with respect to the first end portion direction D61. For example, the third fixed end direction D73 is aligned with the first fixed end direction D71. The third fixed end 73e is connected to the supporter 70s. The third film portion 73 includes a third film portion end 73f (e.g., a free end) (referring to FIG. 8B).

As shown in FIG. 8B, the third sensing element 53 is fixed to the third film portion 73. The third sensing element 53 includes a third magnetic layer 13a, a third opposing magnetic layer 13b, and a third intermediate layer 13c. The third opposing magnetic layer 13b is provided between the third magnetic layer 13a and the third film portion 73. The third intermediate layer 13c is provided between the third magnetic layer 13a and the third opposing magnetic layer 13b.

As shown in FIG. 8A, the direction from the first sensing element 51 toward the third sensing element 53 is aligned with a first fixed end cross direction Dc71. The first fixed end cross direction Dc71 crosses a plane including the first fixed end direction D71 and the first element direction Ds1.

As shown in FIG. 8A, the direction from the first fixed end 71e of the first film portion 71 toward the third fixed end 73e of the third film portion 73 is aligned with the first fixed end cross direction Dc71.

On the other hand, the fourth film portion 74 also is supported by the supporter 70s. The fourth film portion 74 is deformable. The fourth film portion 74 includes a fourth fixed end 74e. The fourth fixed end 74e extends along a fourth fixed end direction D74. The fourth fixed end direction D74 is tilted with respect to the first end portion direction D61. For example, the fourth fixed end direction D74 is aligned with the first fixed end direction D71. The fourth fixed end 74e is connected to the supporter 70s. The fourth film portion 74 includes a fourth film portion end 74f (e.g., a free end) (referring to FIG. 8C).

As shown in FIG. 8C, the fourth sensing element 54 is fixed to the fourth film portion 74. The fourth sensing element 54 includes a fourth magnetic layer 14a, a fourth opposing magnetic layer 14b, and a fourth intermediate layer 14c. The fourth opposing magnetic layer 14b is provided between the fourth magnetic layer 14a and the fourth film portion 74. The fourth intermediate layer 14c is provided between the fourth magnetic layer 14a and the fourth opposing magnetic layer 14b.

As shown in FIG. 8A, the direction from the second sensing element 52 toward the fourth sensing element 54 is aligned with a second fixed end cross direction Dc72. The second fixed end cross direction Dc72 crosses a plane including the second fixed end direction D72 and the first element direction Ds1. In the example, the second fixed end cross direction Dc72 is substantially parallel to the first fixed end cross direction Dc71.

As shown in FIG. 8A, the direction from the second fixed end 72e of the second film portion 72 toward the fourth fixed end 74e of the fourth film portion 74 is aligned with the second fixed end cross direction Dc72.

In the sensor 112, two "cantilever beams" form one set. By using such sets, for example, a structure is obtained in which roll-off does not occur easily.

In FIG. 8A, the third sensing element 53 may be considered to be the "second sensing element." The third film portion 73 may be considered to be the "second film portion." The third fixed end 73e may be considered to be the "second fixed end." In such a case, the direction from the first sensing element 51 toward the second sensing element (the third sensing element 53) is aligned with the first fixed end cross direction Dc71 crossing a plane including the first fixed end direction D71 and the first element direction Ds1. The direction from the first fixed end 71e toward the second fixed end (the third fixed end 73e) is aligned with the first fixed end cross direction Dc71. For example, the third sensing element 53 may be electrically connected in series with at least one of the first sensing element or the second sensing element.

In the sensors 110a, 110b, 111, 111a, and 112 as well, the sensing sensitivity can be increased.

Figure 9:
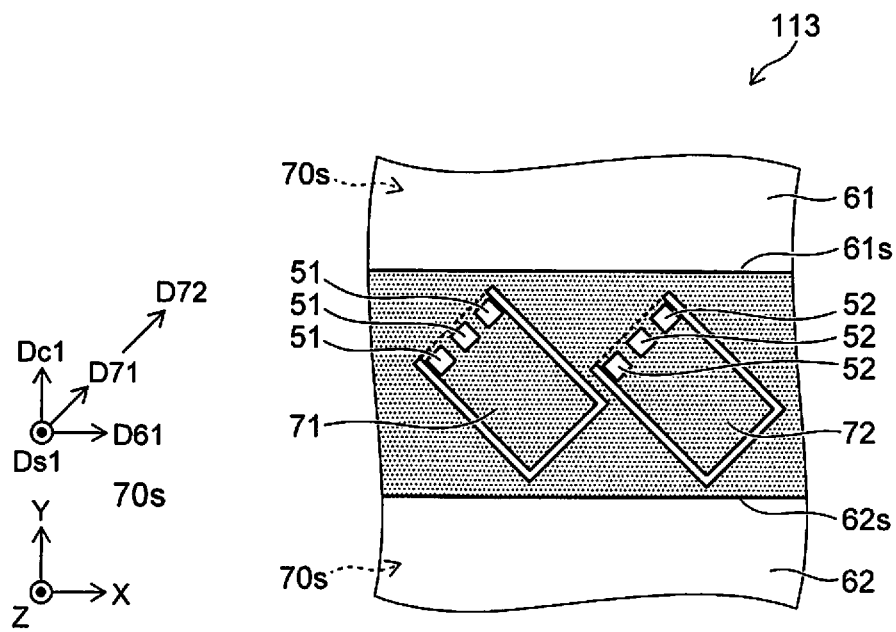
FIG. 9 is a schematic plan view illustrating another sensor according to the first embodiment.

FIG. 9 is a schematic plan view illustrating another sensor according to the first embodiment.

As shown in FIG. 9, the supporter 70s, the first film portion 71, the second film portion 72, the first magnetic portion 61, the second magnetic portion 62, the first sensing element 51, and the second sensing element 52 are provided in the sensor 113 as well. In the sensor 113, the first sensing element 51 is multiply provided; and the second sensing element 52 is multiply provided. Otherwise, the configuration of the sensor 113 is similar to, for example, the configuration of the sensor 110.

The multiple first sensing elements 51 are fixed to the first film portion 71. The multiple first sensing elements 51 are arranged along the first fixed end direction D71. For example, the position along the first fixed end direction D71 of one of the multiple first sensing elements 51 is different from the position along the first fixed end direction D71 of another one of the multiple first sensing elements 51.

Thus, by providing the multiple first sensing elements 51, the SNR (SN ratio) of the sensing can be improved.

For example, one of the multiple first sensing elements 51 is electrically connected to another one of the multiple first sensing elements 51. For example, the multiple first sensing elements 51 are electrically connected in series. For example, the number of the first sensing elements 51 connected in series is taken as n. The strength of the obtained signal is n times. The noise is $n^{1/2}$ times. The SNR is $n^{1/2}$ times.

Similarly, the multiple second sensing elements 52 are fixed to the second film portion 72. For example, the position along the second fixed end direction D72 of one of the multiple second sensing elements 52 is different from the position along the second fixed end direction D72 of another one of the multiple second sensing elements 52. For example, the one of the multiple second sensing elements 52 is electrically connected in series with the other one of the multiple second sensing elements 52. The SNR of the sensing can be improved.

For example, at least one of the multiple first sensing elements 51 and at least one of the multiple second sensing elements 52 may be electrically connected in series.

Figure 10:
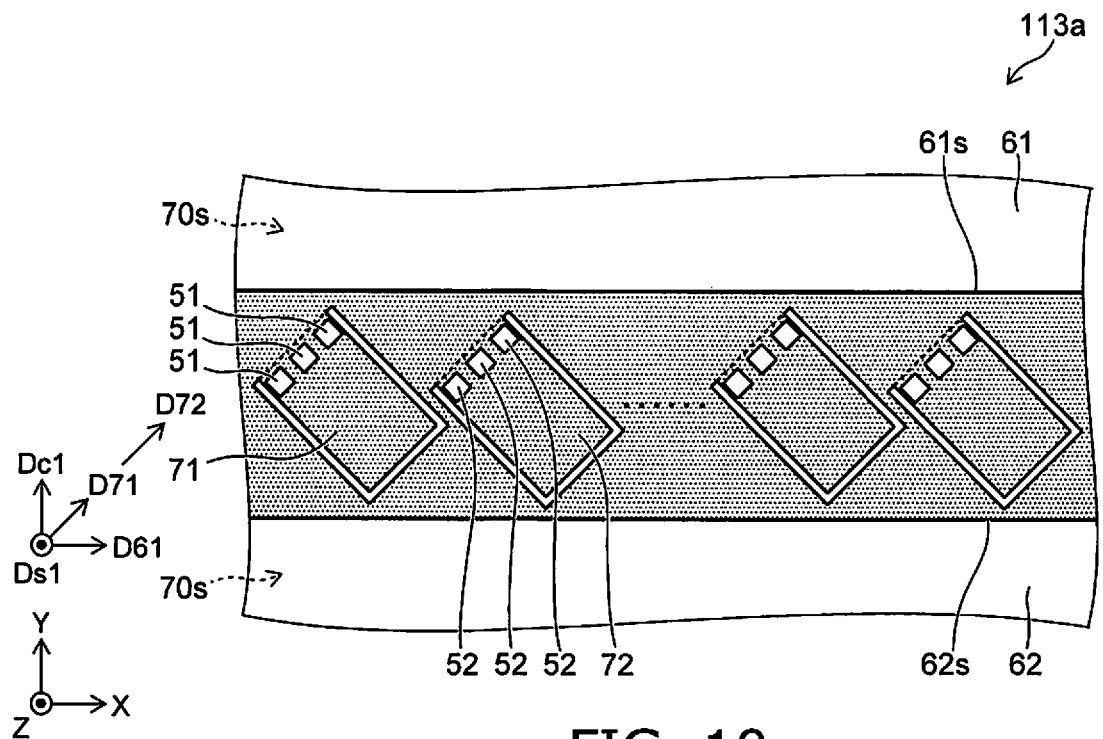
FIG. 10 is a schematic plan view illustrating another sensor according to the first embodiment.

FIG. 10 is a schematic plan view illustrating another sensor according to the first embodiment.

As shown in FIG. 10, the number of film portions (the first film portion 71, the second film portion 72, etc.) in the sensor 113a is four or more. Thus, the number of film portions is arbitrary.

Figure 11:
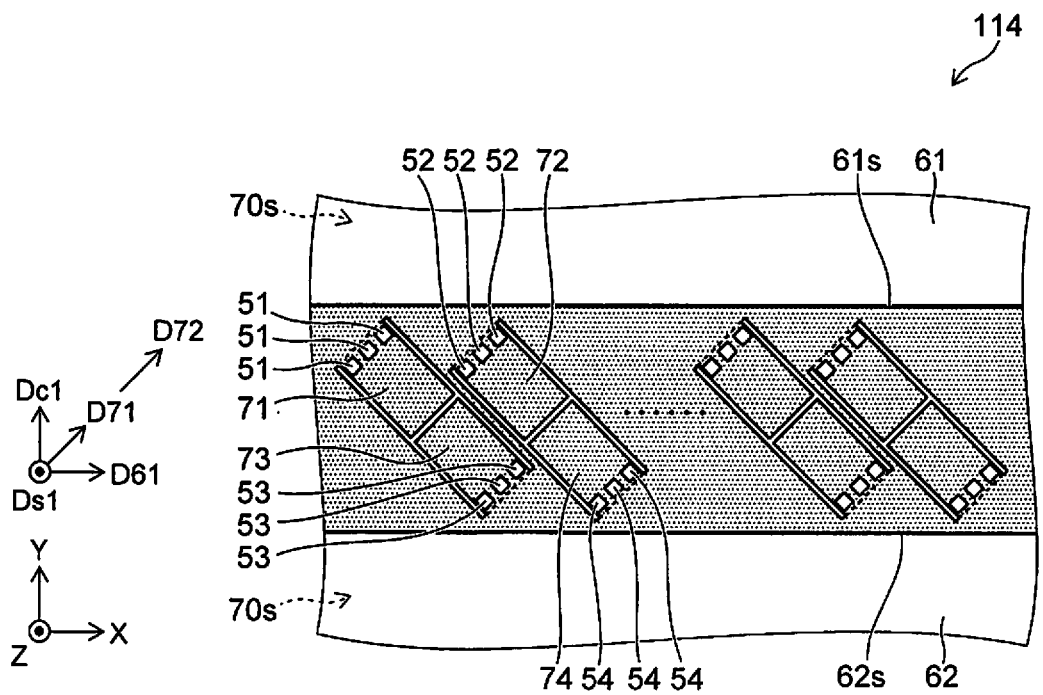
FIG. 11 is a schematic plan view illustrating another sensor according to the first embodiment.

FIG. 11 is a schematic plan view illustrating another sensor according to the first embodiment.

In the sensor 114 as shown in FIG. 11, two "cantilever beams" form one set. Multiple sets are arranged along the first end portion direction D61.

Figure 12:
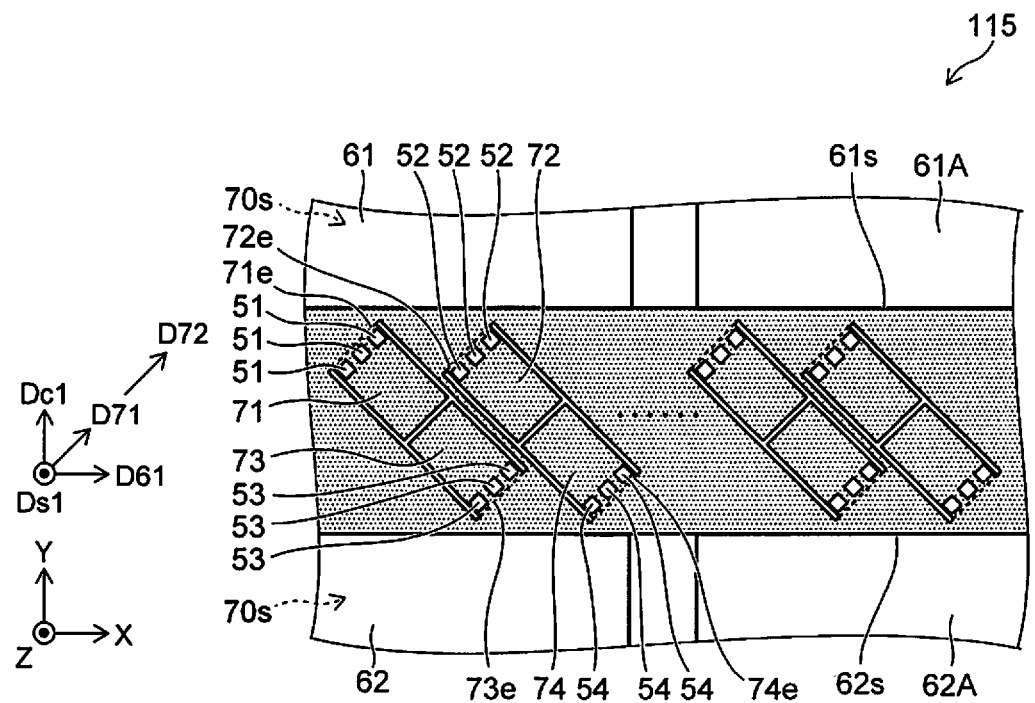
FIG. 12 is a schematic plan view illustrating another sensor according to the first embodiment.

FIG. 12 is a schematic plan view illustrating another sensor according to the first embodiment.

As shown in FIG. 12, two "cantilever beams" form one set in the sensor 115 as well. The sets are provided between the first magnetic portion 61 and the second magnetic portion 62. A third magnetic portion 61A and a fourth magnetic portion 62A are further provided in the example. The third magnetic portion 61A and the fourth magnetic portion 62A overlap the supporter 70s in the Z-axis direction (the first element direction Ds1). The end portions of the third magnetic portion 61A and the fourth magnetic portion 62A extend along the first end portion direction D61 (the X-axis direction). Other sets are provided between the third magnetic portion 61A and the fourth magnetic portion 62A.

Figure 13A:
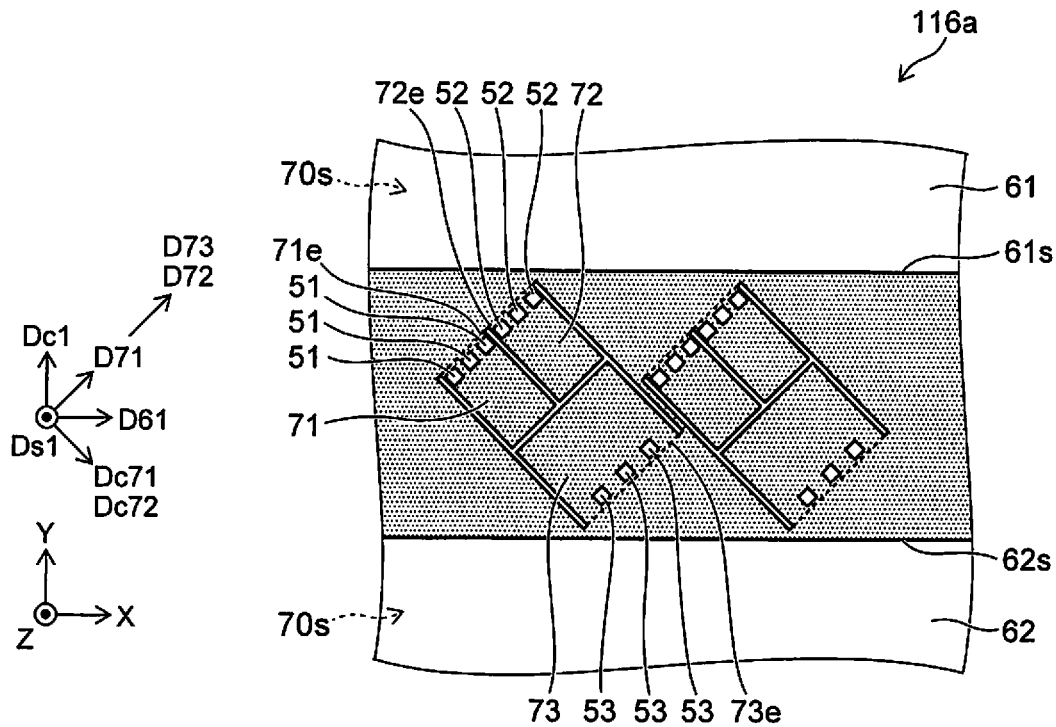
FIG. 13A and FIG. 13B are schematic plan views illustrating other sensors according to the first embodiment.
Figure 13B:
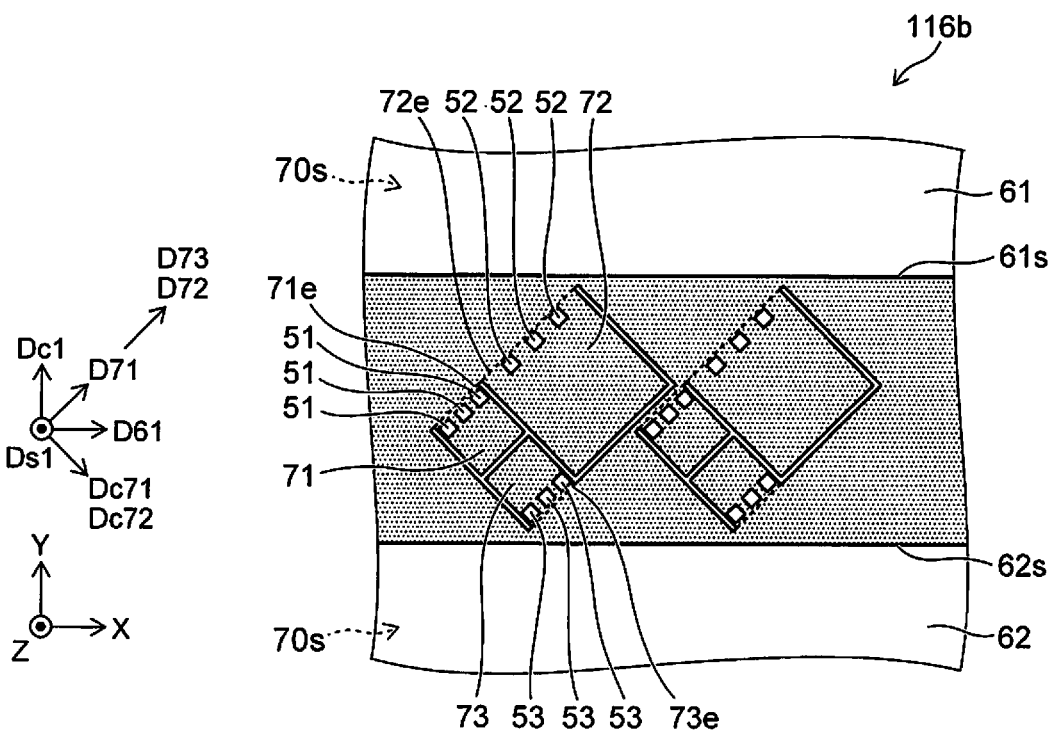

FIG. 13A and FIG. 13B are schematic plan views illustrating other sensors according to the first embodiment.

As shown in FIG. 13A, the first film portion 71, the second film portion 72, and the third film portion 73 are provided in a sensor 116a. The direction from the first fixed end 71e of the first film portion 71 toward the third fixed end 73e of the third film portion 73 is aligned with the first fixed end cross direction Dc71. The direction from the first sensing element 51 toward the third sensing element 53 is aligned with the first fixed end cross direction Dc71. The first fixed end cross direction Dc71 crosses the first fixed end direction D71. The direction from the third film portion 73 toward a portion of the second film portion 72 is aligned with the first end portion direction D61.

On the other hand, the direction from the first fixed end 71e of the first film portion 71 toward the second fixed end 72e of the second film portion 72 is aligned with the first end portion direction D61. The direction from the first sensing element 51 toward the second sensing element 52 is aligned with the first end portion direction D61.

In the sensor 116a, the length of the beam of the first film portion 71 may be different from the length of the beam of the second film portion 72. For example, forces of different frequency bands (e.g., vibrations, sound waves, etc.) can be sensed with high sensitivity. The length of the beam of the first film portion 71 is, for example, the distance between the first fixed end 71e and the first film portion end 71f. The length of the beam of the second film portion 72 is, for example, the distance between the second fixed end 72e and the second film portion end 72f. For example, the length of the beam of the first film portion 71 corresponds to the length of the first film portion 71 along a direction crossing a plane including the first fixed end direction D71 and the first element direction Ds1. For example, the length of the beam of the second film portion 72 corresponds to the length of the second film portion 72 along a direction crossing a plane including the second fixed end direction D72 and the first element direction Ds1.

As shown in FIG. 13B, the first film portion 71, the second film portion 72, and the third film portion 73 are provided in a sensor 116b as well. The direction from the first fixed end 71e of the first film portion 71 toward the second fixed end 72e of the second film portion 72 is aligned with the first end portion direction D61. The direction from the first sensing element 51 toward the second sensing element 52 is aligned with the first end portion direction D61. The direction from the second film portion 72 toward a portion of the third film portion 73 is aligned with the first end portion direction D61.

The direction from the first fixed end 71e of the first film portion 71 toward the third fixed end 73e of the third film portion 73 is aligned with the first fixed end cross direction Dc71. The direction from the first sensing element 51 toward the third sensing element 53 is aligned with the first fixed end cross direction Dc71. The first fixed end cross direction Dc71 crosses the first fixed end direction D71.

In the sensor 116b, the length of the beam of the first film portion 71 is different from the length of the beam of the second film portion 72. In the sensor 116b, the length of the beam of the first film portion 71 may be different from the length of the beam of the third film portion 73. For example, forces of different frequency bands (e.g., vibrations, sound waves, etc.) can be sensed with high sensitivity. The length of the beam of the third film portion 73 is, for example, the distance between the third fixed end 73e and the third film portion end 73f. For example, the length of the beam of the third film portion 73 corresponds to the length of the third film portion 73 along a direction crossing a plane including the third fixed end direction D73 and the first element direction Ds1.

Figure 14:
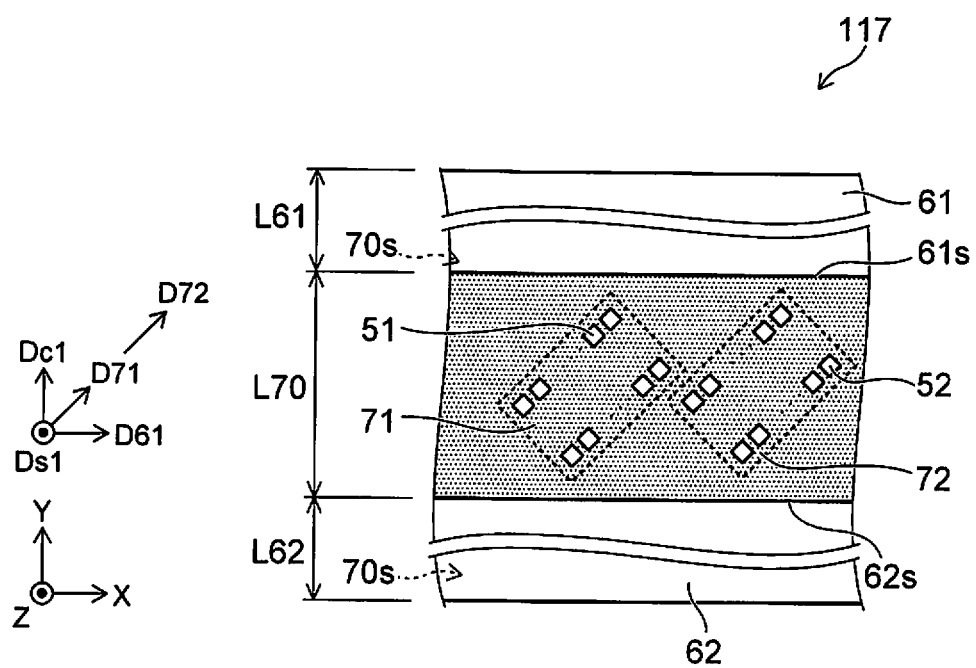
FIG. 14 is a schematic plan view illustrating another sensor according to the first embodiment.

FIG. 14 is a schematic plan view illustrating another sensor according to the first embodiment.

In the sensor 117 as shown in FIG. 14, the entire outer edge of the first film portion 71 may be supported by the supporter 70s. The entire outer edge of the second film portion 72 may be supported by the supporter 70s. The multiple first sensing elements 51 are fixed to the first film portion 71. The multiple first sensing elements 51 are arranged along the first fixed end direction D71.

Figure 15:
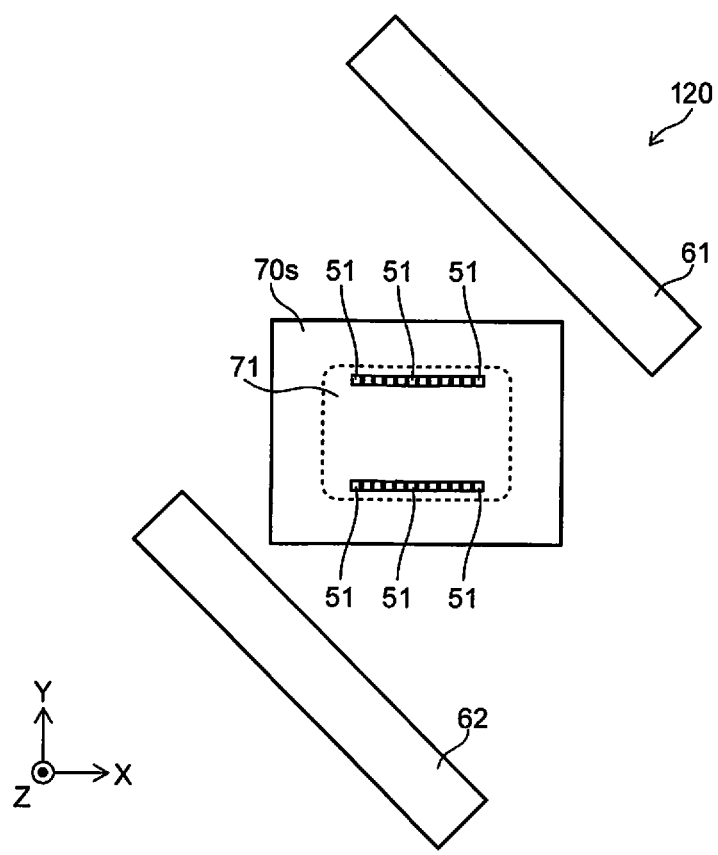
FIG. 15 is a schematic plan view illustrating another sensor according to the first embodiment.

FIG. 15 is a schematic plan view illustrating another sensor according to the first embodiment.

In the sensor 120 as shown in FIG. 15, the supporter 70s, the first film portion 71, and the second film portion 72 may be provided between the first magnetic portion 61 and the second magnetic portion 62. In such a case, the first magnetic portion 61 and the second magnetic portion 62 may not be supported by the supporter 70s. For example, the first magnetic portion 61 and the second magnetic portion 62 may be supported by a substrate such as a printed circuit board, etc. For example, the first magnetic portion 61 and the second magnetic portion 62 may be supported by a housing such as a cover, etc.

Examples of sensing elements used in the first embodiment will now be described. In the following description, the notation "material A/material B" indicates a state in which a layer of the material B is provided on a layer of the material A.

Figure 16:
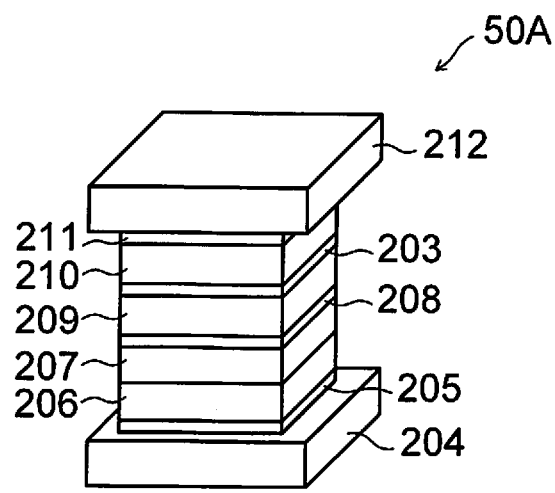
FIG. 16 is a schematic perspective view illustrating a portion of the sensor according to the embodiment.

FIG. 16 is a schematic perspective view illustrating a portion of the sensor according to the embodiment.

In the sensing element 50A as shown in FIG. 16, a lower electrode 204, the foundation layer 205, the pinning layer 206, a second fixed magnetic layer 207, a magnetic coupling layer 208, a first fixed magnetic layer 209, an intermediate layer 203, a free magnetic layer 210, a capping layer 211, and an upper electrode 212 are arranged in this order. The sensing element 50A is, for example, a bottom spin-valve type.

The foundation layer 205 includes, for example, a stacked film of tantalum and ruthenium (Ta/Ru). The thickness (the length in the Z-axis direction) of the Ta layer is, for example, 3 nanometers (nm). The thickness of the Ru layer is, for example, 2 nm. The pinning layer 206 includes, for example, an IrMn-layer having a thickness of 7 nm. The second fixed magnetic layer 207 includes, for example, a $Co_{75}Fe_{25}$ layer having a thickness of 2.5 nm. The magnetic coupling layer 208 includes, for example, a Ru layer having a thickness of 0.9 nm. The first fixed magnetic layer 209 includes, for example, a $Co_{40}Fe_{40}B_{20}$ layer having a thickness of 3 nm. The intermediate layer 203 includes, for example, a MgO layer having a thickness of 1.6 nm. The free magnetic layer 210 includes, for example, $Co_{40}Fe_{40}B_{20}$ having a thickness of 4 nm. The capping layer 211 includes, for example, Ta/Ru. The thickness of the Ta layer is, for example, 1 nm. The thickness of the Ru layer is, for example, 5 nm.

The lower electrode 204 and the upper electrode 212 include, for example, at least one of aluminum (Al), an aluminum copper alloy (Al—Cu), copper (Cu), silver (Ag), gold (Au), a copper-silver alloy (Cu—Ag), platinum (Pt), or palladium (Pd). By using such a material having a relatively small electrical resistance as the lower electrode 204 and the upper electrode 212, the current can be caused to flow efficiently in the sensing element 50A. The lower electrode 204 and the upper electrode 212 include nonmagnetic materials. The lower electrode 204 and the upper electrode 212 may include the at least one of the elements recited above and another element (an added element). The added element is, for example, Si. The lower electrode 204 and the upper electrode 212 may include, for example, a Corson alloy (Cu—Ni—Si), etc.

The lower electrode 204 and the upper electrode 212 may include, for example, a foundation layer (not illustrated) for the lower electrode 204 and the upper electrode 212, a capping layer (not illustrated) for the lower electrode 204 and the upper electrode 212, and a layer of at least one of Al, Al—Cu, Cu, Ag, Au, Cu—Ag, Pt, or Pd provided between the foundation layer and the capping layer. For example, the lower electrode 204 and the upper electrode 212 include tantalum (Ta)/copper (Cu)/tantalum (Ta), etc. For example, by using Ta as the foundation layer of the lower electrode 204 and the upper electrode 212, the adhesion between the film portion (e.g., first film portion 71, etc.) and the lower electrode 204 and between the film portion (e.g., first film portion 71, etc.) and the upper electrode 212 improves. Titanium (Ti), titanium nitride (TiN), etc., may be used as the foundation layer for the lower electrode 204 and the upper electrode 212. The lower electrode 204 and the upper electrode 212 may include a foundation layer, a capping layer, and a layer of a Corson alloy provided between the foundation layer and the capping layer. The capping layer recited above may include, for example, at least one selected from the group consisting of tantalum nitride (TaN), a tantalum-molybdenum alloy (Ta—Mo), tungsten, and a tungsten-molybdenum alloy (W—Mo).

By using Ta as the capping layer of the lower electrode 204 and the upper electrode 212, the oxidization of the copper (Cu), etc., under the capping layer is suppressed. Titanium (Ti), titanium nitride (TiN), etc., may be used as the capping layer for the lower electrode 204 and the upper electrode 212.

The foundation layer 205 includes, for example, a stacked structure including a buffer layer (not illustrated) and a seed layer (not illustrated). For example, the buffer layer relaxes the roughness of the surfaces of the lower electrode 204, the film portion (e.g., first film portion 71, etc.), etc., and improves the crystallinity of the layers stacked on the buffer layer. For example, at least one selected from the group consisting of tantalum (Ta), titanium (Ti), vanadium (V), tungsten (W), zirconium (Zr), hafnium (Hf), and chrome (Cr) is used as the buffer layer. An alloy that includes at least one material selected from these materials may be used as the buffer layer.

It is favorable for the thickness of the buffer layer of the foundation layer 205 to be not less than 1 nm and not more than 10 nm. It is more favorable for the thickness of the buffer layer to be not less than 1 nm and not more than 5 nm. In the case where the thickness of the buffer layer is too thin, the buffering effect is lost. In the case where the thickness of the buffer layer is too thick, the thickness of the sensing element 50A becomes excessively thick. The seed layer is formed on the buffer layer; and, for example, the seed layer has a buffering effect. In such a case, the buffer, layer may be omitted. The buffer layer includes, for example, a Ta layer having a thickness of 3 nm.

The seed layer of the foundation layer 205 controls the crystal orientation of the layers stacked on the seed layer. The seed layer controls the crystal grain size of the layers stacked on the seed layer. As the seed layer, a metal having a fcc structure (face-centered cubic structure), a hcp structure (hexagonal close-packed structure), a bcc structure (body-centered cubic structure), or the like is used.

For example, the crystal orientation of the spin-valve film on the seed layer can be set to the fcc (111) orientation by using, as the seed layer of the foundation layer 205, ruthenium (Ru) having a hcp structure, NiFe having a fcc structure, or Cu having a fcc structure. The seed layer includes, for example, a Cu layer having a thickness of 2 nm or a Ru layer having a thickness of 2 nm. To increase the crystal orientation of the layers formed on the seed layer, it is favorable for the thickness of the seed layer to be not less than 1 nm and not more than 5 nm. It is more favorable for the thickness of the seed layer to be not less than 1 nm and not more than 3 nm. Thereby, the function as a seed layer that improves the crystal orientation is realized sufficiently.

On the other hand, for example, the seed layer may be omitted in the case where it is unnecessary for the layers formed on the seed layer to have a crystal orientation (e.g., in the case where an amorphous free magnetic layer is formed, etc.). For example, a Ru layer having a thickness of 2 nm is used as the seed layer.

For example, the pinning layer 206 provides unidirectional anisotropy to the second fixed magnetic layer 207 (the ferromagnetic layer) formed on the pinning layer 206 and fixes the magnetization of the second fixed magnetic layer 207. The pinning layer 206 includes, for example, an antiferromagnetic layer. The pinning layer 206 includes, for example, at least one selected from the group consisting of Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. An alloy may be used in which an added element is further added to at least one selected from the group consisting of Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. The thickness of the pinning layer 206 is set appropriately. Thereby, for example, unidirectional anisotropy of sufficient strength is provided.

For example, heat treatment is performed while applying a magnetic field. Thereby, for example, the magnetization of the ferromagnetic layer contacting the pinning layer 206 is fixed. The magnetization of the ferromagnetic layer contacting the pinning layer 206 is fixed in the direction of the magnetic field applied in the heat treatment. For example, the heat treatment temperature (the annealing temperature) is not less than the magnetization pinning temperature of the antiferromagnetic material included in the pinning layer 206. In the case where an antiferromagnetic layer including Mn is used, there are cases where the MR ratio decreases due to the Mn diffusing into layers other than the pinning layer 206. It is desirable for the heat treatment temperature to be set to be not more than the temperature at which the diffusion of Mn occurs. The heat treatment temperature is, for example, not less than 200° C. and not more than 500° C. Favorably, the heat treatment temperature is, for example, not less than 250° C. and not more than 400° C.

In the case where PtMn or PdPtMn is used as the pinning layer 206, it is favorable for the thickness of the pinning layer 206 to be not less than 8 nm and not more than 20 nm. It is more favorable for the thickness of the pinning layer 206 to be not less than 10 nm and not more than 15 nm. In the case where IrMn is used as the pinning layer 206, unidirectional anisotropy can be provided using a thickness that is thinner than the case where PtMn is used as the pinning layer 206. In such a case, it is favorable for the thickness of the pinning layer 206 to be not less than 4 nm and not more than 18 nm. It is more favorable for the thickness of the pinning layer 206 to be not less than 5 nm and not more than 15 nm. The pinning layer 206 includes, for example, an $Ir_{22}Mn_{78}$ layer having a thickness of 7 nm.

A hard magnetic layer may be used as the pinning layer 206. For example, Co—Pt, Fe—Pt, Co—Pd, Fe—Pd, etc., may be used as the hard magnetic layer. For example, the magnetic anisotropy and the coercivity are relatively high for these materials. These materials are hard magnetic materials. An alloy in which an added element is further added to Co—Pt, Fe—Pt, Co—Pd, or Fe—Pd may be used as the pinning layer 206. For example, CoPt (the proportion of Co being not less than 50 at. % and not more than 85 at. %), $(Co_xPt_{100-x})_{100-y}Cr_y$ (x being not less than 50 at. % and not more than 85 at. %, and y being not less than 0 at. % and not more than 40 at. %), FePt (the proportion of Pt being not less than 40 at. % and not more than 60 at. %), etc., may be used.

The second fixed magnetic layer 207 includes, for example, a $Co_xFe_{100-x}$ alloy (x being not less than 0 at. % and not more than 100 at. %) or a $Ni_xFe_{100-x}$ alloy (the x being not less than 0 at. % and not more than 100 at. %). These materials may include a material to which a nonmagnetic element is added. For example, at least one selected from the group consisting of Co, Fe, and Ni is used as the second fixed magnetic layer 207. An alloy that includes at least one material selected from these materials may be used as the second fixed magnetic layer 207. Also, a $(Co_xFe_{100-x})_{100-y}B_y$ alloy (x being not less than 0 at. % and not more than 100 at. %, and y being not less than 0 at. % and not more than 30 at. %) may be used as the second fixed magnetic layer 207. By using an amorphous alloy of $(C_xFe_{100-x})_{100-y}B_y$ as the second fixed magnetic layer 207, the fluctuation of the characteristics of the sensing element 50A can be suppressed even in the case where the sizes of the sensing elements are small.

For example, it is favorable for the thickness of the second fixed magnetic layer 207 to be not less than 1.5 nm and not more than 5 nm. Thereby, for example, the strength of the unidirectional anisotropic magnetic field due to the pinning layer 206 can be stronger. For example, the strength of the antiferromagnetic coupling magnetic field between the second fixed magnetic layer 207 and the first fixed magnetic layer 209 via the magnetic coupling layer formed on the second fixed magnetic layer 207 can be stronger. For example, it is favorable for the magnetic thickness (the product (Bs·t) of a saturation magnetization Bs and a thickness t) of the second fixed magnetic layer 207 to be substantially equal to the magnetic thickness of the first fixed magnetic layer 209.

The saturation magnetization of the thin film of $Co_{40}Fe_{40}B_{20}$ is about 1.9 T (teslas). For example, in the case where a $Co_{40}Fe_{40}B_{20}$ layer having a thickness of 3 nm is used as the first fixed magnetic layer 209, the magnetic thickness of the first fixed magnetic layer 209 is 1.9 T×3 nm, i.e., 5.7 Tnm. On the other hand, the saturation magnetization of $Co_{75}Fe_{25}$ is about 2.1 T. The thickness of the second fixed magnetic layer 207 to obtain a magnetic thickness equal to that recited above is 5.7 Tnm/2.1 T, i.e., 2.7 nm. In such a case, it is favorable for a $Co_{75}Fe_{25}$ layer having a thickness of about 2.7 nm to be included in the second fixed magnetic layer 207. For example, a $Co_{75}Fe_{25}$ layer having a thickness of 2.5 nm is used as the second fixed magnetic layer 207.

In the sensing element 50A, a synthetic pinned structure that is made of the second fixed magnetic layer 207, the magnetic coupling layer 208, and the first fixed magnetic layer 209 is used. A single pinned structure that is made of one fixed magnetic layer may be used instead. In the case where the single pinned structure is used, for example, a $Co_{40}Fe_{40}B_{20}$ layer having a thickness of 3 nm is used as the fixed magnetic layer. The same material as the material of the second fixed magnetic layer 207 described above may be used as the ferromagnetic layer included in the fixed magnetic layer having the single pinned structure.

The magnetic coupling layer 208 causes antiferromagnetic coupling to occur between the second fixed magnetic layer 207 and the first fixed magnetic layer 209. The magnetic coupling layer 208 has a synthetic pinned structure. For example, Ru is used as the material of the magnetic coupling layer 208. For example, it is favorable for the thickness of the magnetic coupling layer 208 to be not less than 0.8 nm and not more than 1 nm. A material other than Ru may be used as the magnetic coupling layer 208 if the material causes sufficient antiferromagnetic coupling to occur between the second fixed magnetic layer 207 and the first fixed magnetic layer 209. For example, the thickness of the magnetic coupling layer 208 is set to a thickness not less than 0.8 nm and not more than 1 nm corresponding to the second peak (2nd peak) of RKKY (Ruderman-Kittel-Kasuya-Yosida) coupling. Further, the thickness of the magnetic coupling layer 208 may be set to a thickness not less than 0.3 nm and not more than 0.6 nm corresponding to the first peak (1st peak) of RKKY coupling. For example, Ru having a thickness of 0.9 nm is used as the material of the magnetic coupling layer 208. Thereby, highly reliable coupling is obtained more stably.

The magnetic layer that is included in the first fixed magnetic layer 209 contributes directly to the MR effect. For example, a Co—Fe—B alloy is used as the first fixed magnetic layer 209. Specifically, a $(Co_xFe_{100-x})_{100-y}B_y$ alloy (x being not less than 0 at. % and not more than 100 at. %, and y being not less than 0 at. % and not more than 30 at. %) also may be used as the first fixed magnetic layer 209. For example, the fluctuation between the elements caused by crystal grains can be suppressed even in the case where the size of the sensing element 50A is small by using a $(Co_xFe_{100-x})_{100-y}B_y$ amorphous alloy as the first fixed magnetic layer 209.

The layer (e.g., the intermediate layer 203) that is formed on the first fixed magnetic layer 209 can be planarized. The defect density of the tunneling insulating layer can be reduced by the planarization of the intermediate layer 203. Thereby, a higher MR ratio is obtained with a lower resistance per area. For example, in the case where MgO is used as the material of the intermediate layer 203, the (100) orientation of the intermediate layer 203 (the MgO layer) can be strengthened by using a $(Co_xF_{100-x})_{100-y}B_y$ amorphous alloy as the first fixed magnetic layer 209. A higher MR ratio is obtained by increasing the (100) orientation of the MgO layer. The $(Co_xFe_{100-x})_{100-y}B_y$ alloy crystallizes using the (100) plane of the MgO layer as a template when annealing. Therefore, good crystal conformation between the MgO and the $(Co_xFe_{100-x})_{100-y}B_y$ alloy is obtained. A higher MR ratio is obtained by obtaining good crystal conformation.

Other than the Co—Fe—B alloy, for example, an Fe—Co alloy may be used as the first fixed magnetic layer 209.

A higher MR ratio is obtained as the thickness of the first fixed magnetic layer 209 increases. For example, a larger fixed magnetic field is obtained as the thickness of the first fixed magnetic layer 209 decreases. A trade-off relationship between the MR ratio and the fixed magnetic field exists for the thickness of the first fixed magnetic layer 209. In the case where the Co—Fe—B alloy is used as the first fixed magnetic layer 209, it is favorable for the thickness of the first fixed magnetic layer 209 to be not less than 1.5 nm and not more than 5 nm. It is more favorable for the thickness of the first fixed magnetic layer 209 to be not less than 2.0 nm and not more than 4 nm.

Other than the materials described above, the first fixed magnetic layer 209 may include a $Co_{90}Fe_{10}$ alloy having a fcc structure, Co having a hcp structure, or a Co alloy having a hcp structure. For example, at least one selected from the group consisting of Co, Fe, and Ni is used as the first fixed magnetic layer 209. An alloy that includes at least one material selected from these materials is used as the first fixed magnetic layer 209. For example, a higher MR ratio is obtained by using an FeCo alloy material having a bcc structure, a Co alloy having a cobalt composition of 50% or more, or a material (a Ni alloy) having a Ni composition of 50% or more as the first fixed magnetic layer 209.

For example, a Heusler magnetic alloy layer such as $Co_2MnGe$, $Co_2FeGe$, $Co_2MnSi$, $Co_2FeSi$, $Co_2MnAl$, $Co_2FeAl$, $Co_2MnGa_{0.5}Ge_{0.5}$, $Co_2FeGa_{0.5}Ge_{0.5}$, etc., also may be used as the first fixed magnetic layer 209. For example, a $Co_{40}Fe_{40}B_{20}$ layer having a thickness of, for example, 3 nm is used as the first fixed magnetic layer 209.

For example, the intermediate layer 203 breaks the magnetic coupling between the first fixed magnetic layer 209 and the free magnetic layer 210.

For example, the material of the intermediate layer 203 includes a metal, an insulator, or a semiconductor. For example, Cu, Au, Ag, or the like is used as the metal. In the case where a metal is used as the intermediate layer 203, the thickness of the intermediate layer is, for example, not less than about 1 nm and not more than about 7 nm. For example, magnesium oxide (MgO, etc.), aluminum oxide ($Al_2O_3$, etc.), titanium oxide (TiO, etc.), zinc oxide (ZnO, etc.), gallium oxide (Ga—O), or the like is used as the insulator or the semiconductor. In the case where the insulator or the semiconductor is used as the intermediate layer 203, the thickness of the intermediate layer 203 is, for example, not less than about 0.6 nm and not more than about 2.5 nm. For example, a CCP (Current-Confined-Path) spacer layer may be used as the intermediate layer 203. In the case where a CCP spacer layer is used as the spacer layer, for example, a structure is used in which a copper (Cu) metal path is formed inside an insulating layer of aluminum oxide ($Al_2O_3$). For example, a MgO layer having a thickness of 1.6 nm is used as the intermediate layer.

The free magnetic layer 210 includes a ferromagnet material. For example, the free magnetic layer 210 includes a ferromagnet material including Fe, Co, and Ni. For example, an FeCo alloy, a NiFe alloy, or the like is used as the material of the free magnetic layer 210. Further, the free magnetic layer 210 includes a Co—Fe—B alloy, an Fe—Co—Si—B alloy, an Fe—Ga alloy having a large λs (magnetostriction constant), an Fe—Co—Ga alloy, a Tb-M-Fe alloy, a Tb-M1-Fe-M2 alloy, an Fe-M3-M4-B alloy, Ni, Fe—Al, ferrite, etc. For example, the λs (the magnetostriction constant) is large for these materials. In the Tb-M-Fe alloy recited above, M is at least one selected from the group consisting of Sm, Eu, Gd, Dy, Ho, and Er. In the Tb-M1-Fe-M2 alloy recited above, M1 is at least one selected from the group consisting of Sm, Eu, Gd, Dy, Ho, and Er. M2 is at least one selected from the group consisting of Ti, Cr, Mn, Co, Cu, Nb, Mo, W, and Ta. In the Fe-M3-M4-13 alloy recited above, M3 is at least one selected from the group consisting of Ti, Cr, Mn, Co, Cu, Nb, Mo, W, and Ta. M4 is at least one selected from the group consisting of Ce, Pr, Nd, Sm, Tb, Dy, and Er. $Fe_3O_4$, $(FeCo)_3O_4$, etc., are examples of the ferrite recited above. The thickness of the free magnetic layer 210 is, for example, 2 nm or more.

The free magnetic layer 210 may include a magnetic material including boron. The free magnetic layer 210 may include, for example, an alloy including boron (B) and at least one element selected from the group consisting of Fe, Co, and Ni. The free magnetic layer 210 includes, for example, a Co—Fe—B alloy or an Fe—B alloy. For example, a $Co_{40}Fe_{40}B_{20}$ alloy is used. Ga, Al, Si, W, etc., may be added in the case where the free magnetic layer 210 includes an alloy including boron (B) and at least one element selected from the group consisting of Fe, Co, and Ni. For example, high magnetostriction is promoted by adding these elements. For example, an Fe—Ga—B alloy, an Fe—Co—Ga—B alloy, or an Fe—Co—Si—B alloy may be used as the free magnetic layer 210. By using such a magnetic material including boron, the coercivity (Hc) of the free magnetic layer 210 is low; and the change of the magnetization direction for the strain is easy. Thereby, high sensitivity is obtained.

It is favorable for the boron concentration (e.g., the composition ratio of boron) of the free magnetic layer 210 to be 5 at. % (atomic percent) or more. Thereby, an amorphous structure is easier to obtain. It is favorable for the boron concentration of the free magnetic layer to be 35 at. % or less. For example, the magnetostriction constant decreases when the boron concentration is too high. For example, it is favorable for the boron concentration of the free magnetic layer to be not less than 5 at. % and not more than 35 at. %; and it is more favorable to be not less than 10 at. % and not more than 30 at. %.

In the case where a portion of the magnetic layer of the free magnetic layer 210 includes $Fe_{1-y}B_y$ ($0<y\leq0.3$) or $(Fe_zX_{1-z})_{1-y}B_y$ (X being Co or Ni, $0.8\leq z<1$, and $0<y\leq0.3$), it is easy to realize both a large magnetostriction constant λ and a low coercivity. Therefore, this is particularly favorable from the perspective of obtaining a high gauge factor. For example, $Fe_{80}B_{20}$ (4 nm) is used as the free magnetic layer 210. $Co_{40}Fe_{40}B_{20}$ (0.5 nm)/$Fe_{80}B_{20}$ (4 nm) is used as the free magnetic layer.

The free magnetic layer 210 may have a multilayered structure. In the case where MgO is used as the intermediate layer 203, it is favorable to provide a layer of a Co—Fe—B alloy at the portion of the free magnetic layer 210 contacting the intermediate layer 203. Thereby, a high magnetoresistance effect is obtained. In such a case, a layer of a Co—Fe—B alloy is provided on the intermediate layer 203; and another magnetic material that has a large magnetostriction constant is provided on the layer of the Co—Fe—B alloy. In the case where the free magnetic layer 210 has the multilayered structure, for example, the free magnetic layer 210 includes Co—Fe—B (2 nm)/Fe—Co—Si—B (4 nm), etc.

The capping layer 211 protects the layers provided under the capping layer 211. The capping layer 211 includes, for example, multiple metal layers. The capping layer 211 includes, for example, a two-layer structure (Ta/Ru) of a Ta layer and a Ru layer. The thickness of the Ta layer is, for example, 1 nm; and the thickness of the Ru layer is, for example, 5 nm. As the capping layer 211, another metal layer may be provided instead of the Ta layer and/or Ru layer. The configuration of the capping layer 211 is arbitrary. For example, a nonmagnetic material is used as the capping layer 211. Another material may be used as the capping layer 211 as long as the material can protect the layers provided under the capping layer 211.

In the case where the free magnetic layer 210 includes a magnetic material including boron, a diffusion suppression layer (not illustrated) of an oxide material and/or a nitride material may be provided between the free magnetic layer 210 and the capping layer 211. Thereby, for example, the diffusion of boron is suppressed. By using the diffusion suppression layer including an oxide layer or a nitride layer, the diffusion of the boron included in the free magnetic layer 210 can be suppressed; and the amorphous structure of the free magnetic layer 210 can be maintained. As the oxide material and/or the nitride material included in the diffusion suppression layer, for example, an oxide material or a nitride material including an element such as Mg, Al, Si, Ti, V, Cr, Mn, Fe, Co, Ni, Cu, Zn, Zr, Nb, Mo, Ru, Rh, Pd, Ag, Hf, Ta, W, Sn, Cd, Ga, or the like is used. The diffusion suppression layer is a layer that does not contribute to the magnetoresistance effect. It is favorable for the resistance per area of the diffusion suppression layer to be low. For example, it is favorable for the resistance per area of the diffusion suppression layer to be set to be lower than the resistance per area of the intermediate layer that contributes to the magnetoresistance effect. From the perspective of reducing the resistance per area of the diffusion suppression layer, it is favorable for the diffusion suppression layer to be an oxide or a nitride of Mg, Ti, V, Zn, Sn, Cd, and Ga. The barrier height is low for these materials. It is favorable to use an oxide having a stronger chemical bond to suppress the diffusion of boron. For example, a MgO layer of 1.5 nm is used. Oxynitrides are included in one of the oxide or the nitride.

In the case where the diffusion suppression layer includes an oxide or a nitride, it is favorable for the thickness of the diffusion suppression layer to be, for example, 0.5 nm or more. Thereby, the diffusion suppression function of the boron is realized sufficiently. It is favorable for the thickness of the diffusion suppression layer to be 5 nm or less. Thereby, for example, a low resistance per area is obtained. It is favorable for the thickness of the diffusion suppression layer to be not less than 0.5 nm and not more than 5 nm; and it is favorable to be not less than 1 nm and not more than 3 nm.

At least one selected from the group consisting of magnesium (Mg), silicon (Si), and aluminum (Al) may be used as the diffusion suppression layer. A material that includes these light elements is used as the diffusion suppression layer. These light elements produce compounds by bonding with boron. For example, at least one of a Mg—B compound, an Al—B compound, or a Si—B compound is formed at the portion including the interface between the diffusion suppression layer and the free magnetic layer 210. These compounds suppress the diffusion of boron.

Another metal layer, etc., may be inserted between the diffusion suppression layer and the free magnetic layer 210. In the case where the distance between the diffusion suppression layer and the free magnetic layer 210 is too long, boron diffuses between the diffusion suppression layer and the free magnetic layer 210; and the boron concentration in the free magnetic layer 210 undesirably decreases. Therefore, it is favorable for the distance between the diffusion suppression layer and the free magnetic layer 210 to be 10 nm or less; and it is more favorable to be 3 nm or less.

Figure 17:
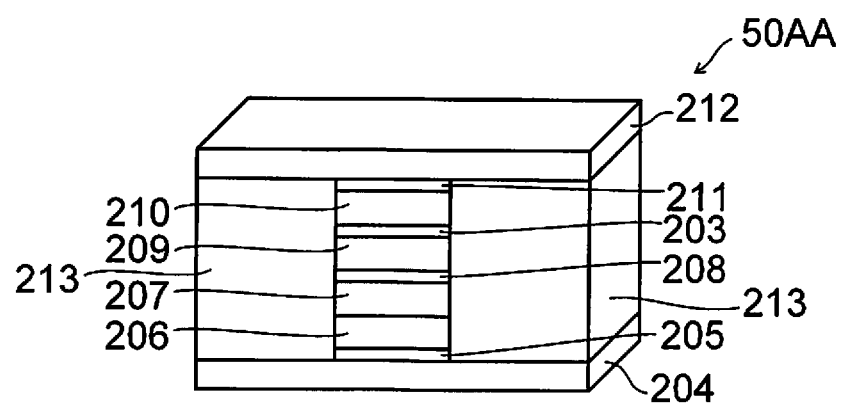
FIG. 17 is a schematic perspective view illustrating a portion of another sensor according to the embodiment.

FIG. 17 is a schematic perspective view illustrating a portion of another sensor according to the embodiment.

As shown in FIG. 17, other than an insulating layer 213 being provided, a sensing element 50AA is similar to the sensing element 50A. The insulating layer 213 is provided between the lower electrode 204 and the upper electrode 212. The insulating layer 213 is arranged with the free magnetic layer 210 and the first fixed magnetic layer 209 in a direction crossing the direction connecting the lower electrode 204 and the upper electrode 212. Portions other than the insulating layer 213 are similar to those of the sensing element 50A; and a description is therefore omitted.

The insulating layer 213 includes, for example, at least one selected from the group consisting of aluminum oxide (e.g., $Al_2O_3$), silicon oxide (e.g., $SiO_2$), and silicon nitride (e.g., $Si_3N4$), etc. The leakage current of the sensing element 50AA is suppressed by the insulating layer 213. The insulating layer 213 may be provided in the sensing elements described below.

Figure 18:
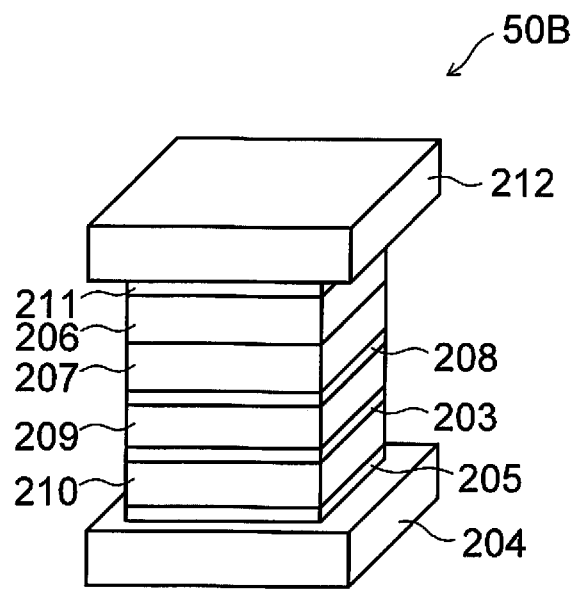
FIG. 18 is a schematic perspective view illustrating a portion of another sensor according to the embodiment.

FIG. 18 is a schematic perspective view illustrating a portion of another sensor according to the embodiment.

In the sensing element 50B as shown in FIG. 18, the lower electrode 204, the foundation layer 205, the free magnetic layer 210, the intermediate layer 203, the first fixed magnetic layer 209, the magnetic coupling layer 208, the second fixed magnetic layer 207, the pinning layer 206, the capping layer 211, and the upper electrode 212 are stacked in order. The sensing element 50B is, for example, a top spin-valve type.

The foundation layer 205 includes, for example, a stacked film of tantalum and copper (Ta/Cu). The thickness (the length in the Z-axis direction) of the Ta layer is, for example, 3 nm. The thickness of the Cu layer is, for example, 5 nm. The free magnetic layer 210 includes, for example, $Co_{40}Fe_{40}B_{20}$ having a thickness of 4 nm. The intermediate layer 203 includes, for example, a MgO layer having a thickness of 1.6 nm. The first fixed magnetic layer 209 includes, for example, $Co_{40}Fe_{40}B_{20}/Fe_{50}Co_{50}$. The thickness of the $Co_{40}Fe_{40}B_{20}$ layer is, for example, 2 nm. The thickness of the $Fe_{50}Co_{50}$ layer is, for example, 1 nm. The magnetic coupling layer 208 includes, for example, a Ru layer having a thickness of 0.9 nm. The second fixed magnetic layer 207 includes, for example, a $Co_{75}Fe_{25}$ layer having a thickness of 2.5 nm. The pinning layer 206 includes, for example, an IrMn-layer having a thickness of 7 nm. The capping layer 211 includes, for example, Ta/Ru. The thickness of the Ta layer is, for example, 1 nm. The thickness of the Ru layer is, for example, 5 nm.

The materials of the layers included in the sensing element 50B may be vertically inverted materials of the layers included in the sensing element 50A. The diffusion suppression layer recited above may be provided between the foundation layer 205 and the free magnetic layer 210 of the sensing element 50B.

Figure 19:
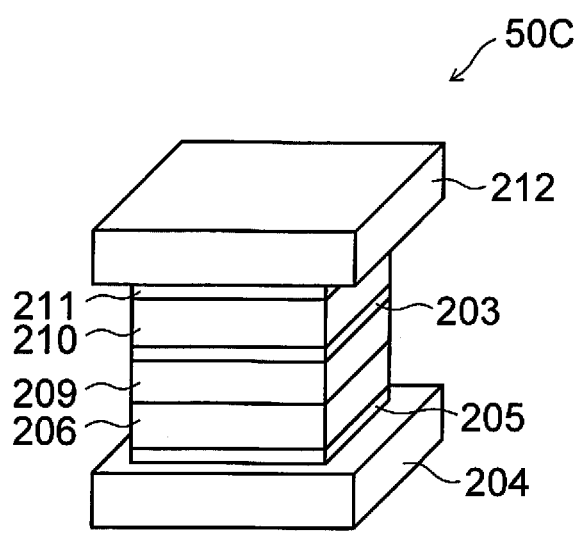
FIG. 19 is a schematic perspective view illustrating a portion of another sensor according to the embodiment.

FIG. 19 is a schematic perspective view illustrating a portion of another sensor according to the embodiment.

In the sensing element 50C as shown in FIG. 19, the lower electrode 204, the foundation layer 205, the pinning layer 206, the first fixed magnetic layer 209, the intermediate layer 203, the free magnetic layer 210, and the capping layer 211 are stacked in this order. For example, the sensing element 50C has a single pinned structure that uses a single fixed magnetic layer.

The foundation layer 205 includes, for example, Ta/Ru. The thickness (the length in the Z-axis direction) of the Ta layer is, for example, 3 nm. The thickness of the Ru layer is, for example, 2 nm. The pinning layer 206 includes, for example, an IrMn-layer having a thickness of 7 nm. The first fixed magnetic layer 209 includes, for example, a $Co_{40}Fe_{40}B_{20}$ layer having a thickness of 3 nm. The intermediate layer 203 includes, for example, a MgO layer having a thickness of 1.6 nm. The free magnetic layer 210 includes, for example, $Co_{40}Fe_{40}B_{20}$ having a thickness of 4 nm. The capping layer 211 includes, for example, Ta/Ru. The thickness of the Ta layer is, for example, 1 nm. The thickness of the Ru layer is, for example, 5 nm.

For example, materials similar to the materials of the layers of the sensing element 50A are used as the materials of the layers of the sensing element 50C.

Figure 20:
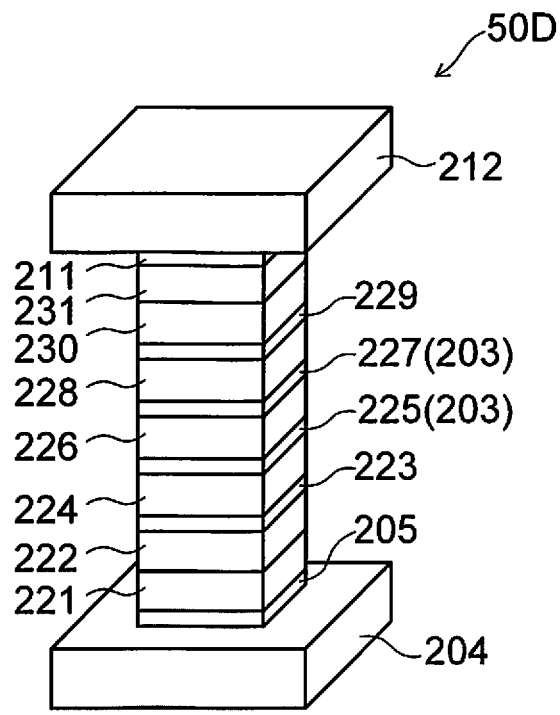
FIG. 20 is a schematic perspective view illustrating a portion of another sensor according to the embodiment.

FIG. 20 is a schematic perspective view illustrating a portion of another sensor according to the embodiment.

In the sensing element 50D as shown in FIG. 20, the lower electrode 204, the foundation layer 205, a lower pinning layer 221, a lower second fixed magnetic layer 222, a lower magnetic coupling layer 223, a lower first fixed magnetic layer 224, a lower intermediate layer 225, a free magnetic layer 226, an upper intermediate layer 227, an upper first fixed magnetic layer 228, an upper magnetic coupling layer 229, an upper second fixed magnetic layer 230, an upper pinning layer 231, and the capping layer 211 are stacked in order.

The foundation layer 205 includes, for example, Ta/Ru. The thickness (the length in the Z-axis direction) of the Ta layer is, for example, 3 nanometers (nm). The thickness of the Ru layer is, for example, 2 nm. The lower pinning layer 221 includes, for example, an IrMn-layer having a thickness of 7 nm. The lower second fixed magnetic layer 222 includes, for example, a $Co_{75}Fe_{25}$ layer having a thickness of 2.5 nm. The lower magnetic coupling layer 223 includes, for example, a Ru layer having a thickness of 0.9 nm. The lower first fixed magnetic layer 224 includes, for example, a $Co_{40}Fe_{40}B_{20}$ layer having a thickness of 3 nm. The lower intermediate layer 225 includes, for example, a MgO layer having a thickness of 1.6 nm. The free magnetic layer 226 includes, for example, $Co_{40}Fe_{40}B_{20}$ having a thickness of 4 nm. The upper intermediate layer 227 includes, for example, a MgO layer having a thickness of 1.6 nm. The upper first fixed magnetic layer 228 includes, for example, $Co_{40}Fe_{40}B_{20}/Fe_{50}Co_{50}$. The thickness of the $Co_{40}Fe_{40}B_{20}$ layer is, for example, 2 nm. The thickness of the $Fe_{50}Co_{50}$ layer is, for example, 1 nm. The upper magnetic coupling layer 229 includes, for example, a Ru layer having a thickness of 0.9 nm. The upper second fixed magnetic layer 230 includes, for example, a $Co_{75}Fe_{25}$ layer having a thickness of 2.5 nm. The upper pinning layer 231 includes, for example, an IrMn-layer having a thickness of 7 nm. The capping layer 211 includes, for example, Ta/Ru. The thickness of the Ta layer is, for example, 1 nm. The thickness of the Ru layer is, for example, 5 nm.

For example, materials similar to the materials of the layers of the sensing element 50A are used as the materials of the layers of the sensing element 50D.

Figure 21:
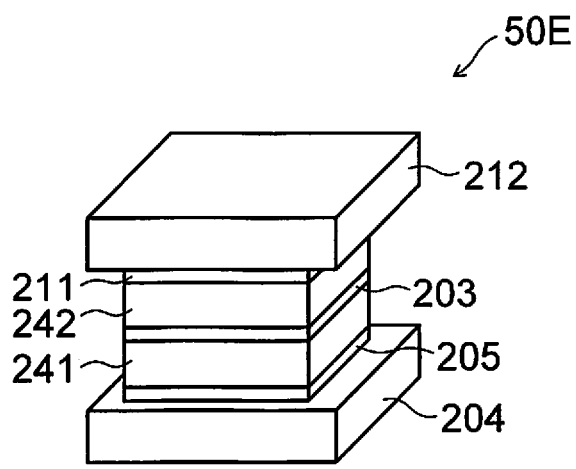
FIG. 21 is a schematic perspective view illustrating a portion of another sensor according to the embodiment.

FIG. 21 is a schematic perspective view illustrating a portion of another sensor according to the embodiment.

In the sensing element 50E as shown in FIG. 21, the lower electrode 204, the foundation layer 205, a first free magnetic layer 241, the intermediate layer 203, a second free magnetic layer 242, the capping layer 211, and the upper electrode 212 are stacked in this order. In the example, the magnetizations of the first opposing magnetic layer 11b and the second opposing magnetic layer 12b are changeable.

The foundation layer 205 includes, for example, Ta/Cu. The thickness (the length in the Z-axis direction) of the Ta layer is, for example, 3 nm. The thickness of the Cu layer is, for example, 5 nm. The first free magnetic layer 241 includes, for example, $Co_{40}Fe_{40}B_{20}$ having a thickness of 4 nm. The intermediate layer 203 includes, for example, $Co_{40}Fe_{40}B_{20}$ having a thickness of 4 nm. The capping layer 211 includes, for example, Cu/Ta/Ru. The thickness of the Cu layer is, for example, 5 nm. The thickness of the Ta layer is, for example, 1 nm. The thickness of the Ru layer is, for example, 5 nm.

Materials similar to the materials of the layers of the sensing element 50A are used as the materials of the layers of the sensing element 50E. For example, materials similar to those of the free magnetic layer 210 of the sensing element 50A may be used as the materials of the first free magnetic layer 241 and the second free magnetic layer 242.

Second Embodiment

Figure 22:
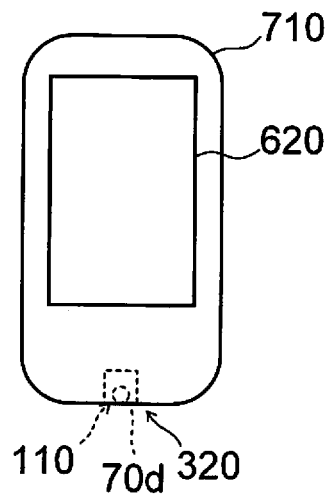
FIG. 22 is a schematic view illustrating an electronic device according to a second embodiment.

FIG. 22 is a schematic view illustrating an electronic device according to a second embodiment.

As shown in FIG. 22, a microphone 320 according to the embodiment includes any sensor or a modification of any sensor according to the embodiments recited above. In the example, the sensor 110 is used as the sensor.

For example, the microphone 320 is provided in an electronic device 710 (e.g., a personal digital assistant). For example, the film portion 70d (e.g., the first film portion 71, etc.) of the sensor 110 is substantially parallel to the surface in which a displayer 620 of the electronic device 710 is provided. The arrangement of the film portion 70d (e.g., the first film portion 71, etc.) is arbitrary. According to the embodiment, a microphone can be provided in which the dynamic range can be enlarged. The microphone 610 according to the embodiment may be provided in, for example, an IC recorder, a pin microphone, etc.

Figure 23:
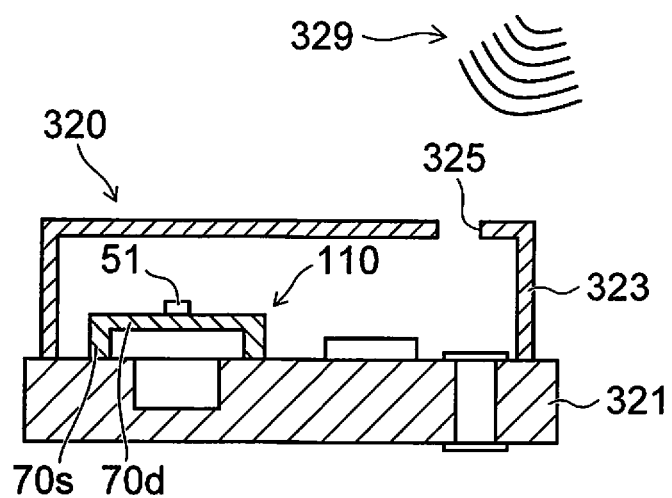
FIG. 23 is a schematic cross-sectional view illustrating the microphone according to the second embodiment.

FIG. 23 is a schematic cross-sectional view illustrating the microphone according to the second embodiment.

The microphone 320 (the acoustic microphone) according to the embodiment includes a first member 321 (e.g., a substrate such as a printed circuit board, etc.), a second member 323 (e.g., a housing such as a cover, etc.), and a sensor. Any sensor or a modification of any sensor according to the embodiments is used as the sensor. In the example, the sensor 110 is used as the sensor. The first member 321 includes, for example, a circuit such as an amplifier, etc. An acoustic hole 325 is provided in the second member 323. Sound 329 passes through the acoustic hole 325 and enters the interior of the second member 323.

The microphone 320 responds to the sound pressure. For example, the sensor 110 is provided on the first member 321. An electrical signal line is provided. The second member 323 is provided on the first member 321 to cover the sensor 110. The supporter 70s, the film portion 70d (e.g., the first film portion 71, etc.), and the first sensing element 51 are positioned between the first member 321 and the second member 323.

Third Embodiment

Figure 24A:
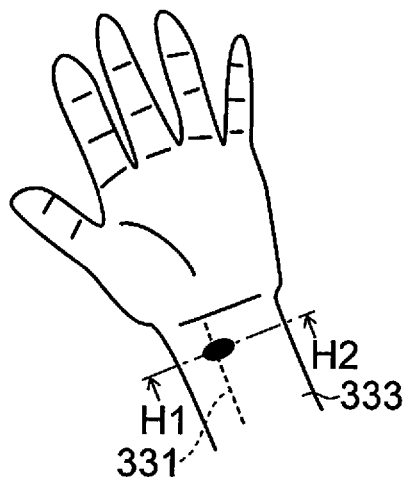
FIG. 24A and FIG. 24B are schematic views illustrating a blood pressure sensor according to a third embodiment.
Figure 24B:
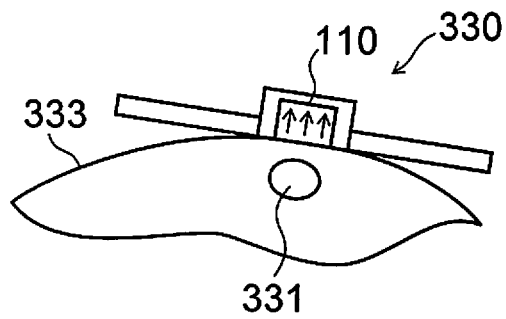

FIG. 24A and FIG. 24B are schematic views illustrating a blood pressure sensor according to a third embodiment.

FIG. 24A is a schematic plan view illustrating skin on an arterial vessel of a human. FIG. 24B is a line H1-H2 cross-sectional view of FIG. 24A.

The blood pressure sensor 330 according to the embodiment includes any sensor or a modification of any sensor according to the embodiments. In the example, the sensor 110 is used as the sensor. The sensor 110 is pressed onto the skin 333 on the arterial vessel 331. Thereby, the blood pressure sensor 330 can continuously perform blood pressure measurements. The blood pressure can be measured with high sensitivity. The blood pressure sensor 330 is one electronic device.

Fourth Embodiment

Figure 25:
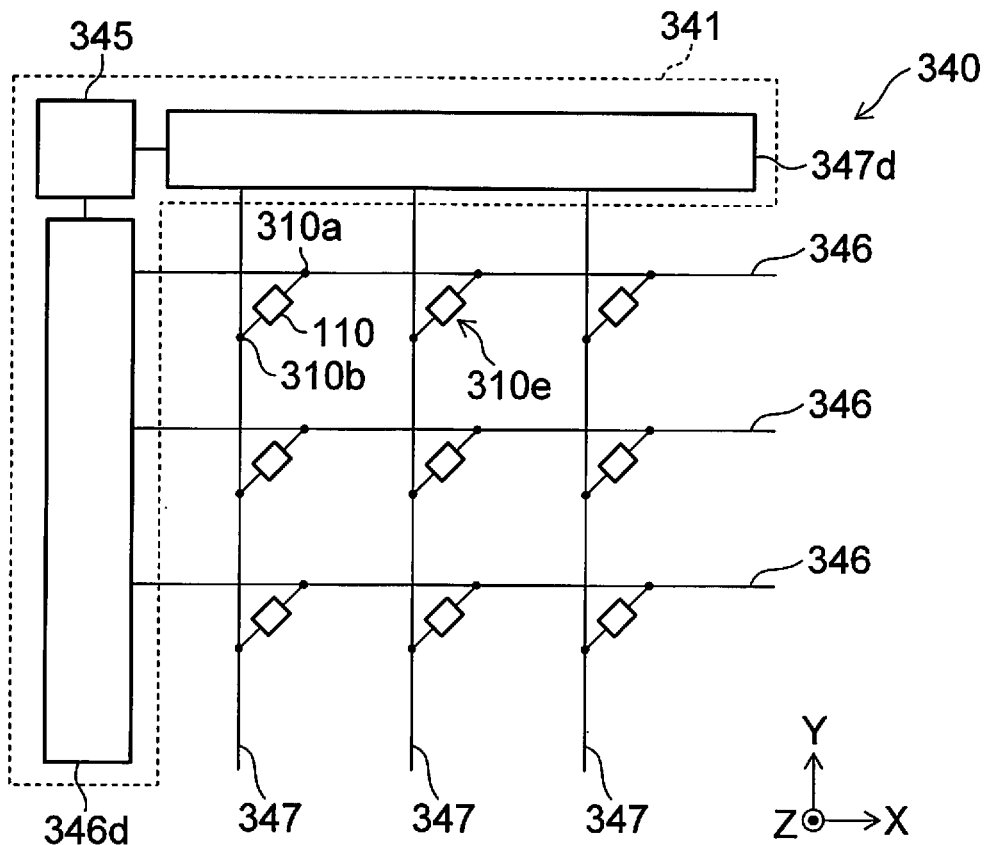
FIG. 25 is a schematic view illustrating a touch panel according to a fourth embodiment.

FIG. 25 is a schematic view illustrating a touch panel according to a fourth embodiment.

The touch panel 340 according to the embodiment includes any sensor or a modification of any sensor according to the embodiments. In the example, the sensor 110 is used as the sensor. In the touch panel 340, the sensors 110 are mounted to at least one of the interior of the display or the exterior of the display. The touch panel 340 is one electronic device.

For example, the touch panel 340 includes multiple first interconnects 346, multiple second interconnects 347, the multiple sensors 110, and a controller 341.

In the example, the multiple first interconnects 346 are arranged along the Y-axis direction. The multiple first interconnects 346 extend along the X-axis direction. The multiple second interconnects 347 are arranged along the X-axis direction. The multiple second interconnects 347 extend along the Y-axis direction.

One of the multiple sensors 110 is provided at the crossing portion between one of the multiple first interconnects 346 and one of the multiple second interconnects 347. One of the sensors 110 is used as one of sensing components 310e for sensing. Here, the crossing portion includes the position where the first interconnect 346 and the second interconnect 347 cross and includes the region at the periphery of the position.

One end 310a of one of the multiple sensors 110 is connected to one of the multiple first interconnects 346. Another end 310b of the one of the multiple sensors 110 is connected to one of the multiple second interconnects 347.

The controller 341 is connected to the multiple first interconnects 346 and the multiple second interconnects 347. For example, the controller 341 includes a first interconnect circuit 346d that is connected to the multiple first interconnects 346, a second interconnect circuit 347d that is connected to the multiple second interconnects 347, and a control circuit 345 that is connected to the first interconnect circuit 346d and the second interconnect circuit 347d. A high definition touch panel is obtained.

The embodiments may include the following configurations (e.g., technological proposals).

Configuration 1

A sensor, comprising:

a supporter;

a first film portion supported by the supporter, the first film portion being deformable, the first film portion including a first fixed end extending along a first fixed end direction;

a first sensing element fixed to the first film portion, the first sensing element including a first magnetic layer, a first opposing magnetic layer provided between the first magnetic layer and the first film portion, and a first intermediate layer provided between the first magnetic layer and the first opposing magnetic layer, a direction from the first opposing magnetic layer toward the first magnetic layer being aligned with a first element direction; and a first magnetic portion including a first end portion extending along a first end portion direction tilted with respect to the first fixed end direction, the first magnetic portion overlapping a portion of the supporter in the first element direction.

Configuration 2

The sensor according to Configuration 1, wherein the first film portion further includes a first film portion end, a direction from the first fixed end toward the first film portion end crosses the first fixed end direction, and the first film portion end is displaceable in the first element direction.

Configuration 3

The sensor according to Configuration 2, wherein a position of the first fixed end in a first cross direction is between a position of the first end portion in the first cross direction and a position of the first film portion end in the first cross direction, the first cross direction crossing a plane including the first end portion direction and the first element direction.

Configuration 4

The sensor according to Configuration 1, wherein the first film portion further includes a first film portion end and a first inner portion, a direction from the first fixed end toward the first film portion end crosses the first fixed end direction, the first inner portion is positioned between the first fixed end and the first film portion end in the direction from the first fixed end toward the first film portion end, and the first inner portion is displaceable in the first element direction.

Configuration 5

The sensor according to Configuration 4, further comprising a first film portion end sensing element fixed to the first film portion, a distance between the first film portion end sensing element and the first fixed end being longer than a distance between the first film portion end sensing element and the first film portion end, a distance between the first sensing element and the first fixed end being shorter than a distance between the first sensing element and the first film portion end, the first film portion end sensing element including a first film portion end magnetic layer, a first opposing film portion end magnetic layer provided between the first film portion end magnetic layer and the first film portion, and a first film portion end intermediate layer provided between the first film portion end magnetic layer and the first opposing film portion end magnetic layer.

Configuration 6

The sensor according to any one of Configurations 1 to 3, further comprising:

a second film portion supported by the supporter, the second film portion being deformable, the second film portion including a second fixed end extending along a second fixed end direction tilted with respect to the first end portion direction; and a second sensing element fixed to the second film portion, the second sensing element including a second magnetic layer, a second opposing magnetic layer provided between the second magnetic layer and the second film portion, and a second intermediate layer provided between the second magnetic layer and the second opposing magnetic layer.

Configuration 7

The sensor according to Configuration 6, wherein a direction from the first sensing element toward the second sensing element is aligned with the first end portion direction.

Configuration 8

The sensor according to Configuration 6 or 7, wherein a direction from the first fixed end toward the second fixed end is aligned with the first end portion direction.

Configuration 9

The sensor according to any one of Configurations 6 to 8, wherein a distance between the first sensing element and the first end portion along a direction perpendicular to a plane including the first end portion direction and the first element direction is not less than 0.8 times and not more than 1.2 times a distance between the second sensing element and the first end portion along the perpendicular direction.

Configuration 10

The sensor according to Configuration 6, wherein a direction from the first sensing element toward the second sensing element is aligned with a first fixed end cross direction crossing a plane including the first fixed end direction and the first element direction.

Configuration 11

The sensor according to Configuration 10, wherein a direction from the first fixed end toward the second fixed end is aligned with the first fixed end cross direction.

Configuration 12

The sensor according to any one of Configurations 6 to 11, wherein a length of the first film portion along a direction crossing a plane including the first fixed end direction and the first element direction is different from a length of the second film portion along a direction crossing a plane including the second fixed end direction and the first element direction.

Configuration 13

The sensor according to any one of Configurations 6 to 9, further comprising:

a third film portion supported by the supporter, the third film portion being deformable, the third film portion including a third fixed end extending along a third fixed end direction crossing the first end portion direction; and a third sensing element fixed to the third film portion, the third sensing element including a third magnetic layer, a third opposing magnetic layer provided between the third magnetic layer and the third film portion, and a third intermediate layer provided between the third magnetic layer and the third opposing magnetic layer, a direction from the first sensing element toward the third sensing element being aligned with a first fixed end cross direction crossing a plane including the first fixed end direction and the first element direction.

Configuration 14

The sensor according to Configuration 13, wherein a direction from the first fixed end toward the third fixed end is aligned with the first fixed end cross direction.

Configuration 15

The sensor according to Configuration 13 or 14, wherein a length of the first film portion along a direction crossing a plane including the first fixed end direction and the first element direction is different from a length of the third film portion along a direction crossing a plane including the third fixed end direction and the first element direction.

Configuration 16

The sensor according to any one of Configurations 1 to 15, further comprising a second magnetic portion, the second magnetic portion overlapping another portion of the supporter in the first element direction, at least a portion of the first sensing element being positioned between the first magnetic portion and the second magnetic portion.

Configuration 17

The sensor according to any one of Configurations 1 to 16, wherein the first sensing element is multiply provided, and a position along the first fixed end direction of one of the multiple first sensing elements is different from a position along the first fixed end direction of another one of the multiple first sensing elements.

Configuration 18

The sensor according to Configuration 17, wherein the one of the multiple first sensing elements is electrically connected to the other one of the multiple first sensing elements.

Configuration 19

The sensor according to any one of Configurations 1 to 18, further comprising:

a first member; and a second member, the supporter, the first film portion, and the first sensing element being positioned between the first member and the second member.

Configuration 20

An electronic device, comprising:

the sensor according to any one of Configurations 1 to 19; and a housing.

Configuration 21

A sensor, comprising:

a supporter;

a first film portion supported by the supporter, the first film portion being deformable, the first film portion including a first fixed end extending along a first fixed end direction;

a first sensing element fixed to the first film portion, the first sensing element including a first magnetic layer, a first opposing magnetic layer provided between the first magnetic layer and the first film portion, and a first intermediate layer provided between the first magnetic layer and the first opposing magnetic layer, a direction from the first opposing magnetic layer toward the first magnetic layer being aligned with a first element direction; and a first magnetic portion including a first end portion extending along a first end portion direction tilted with respect to the first fixed end direction.

Configuration 22

The sensor according to Configuration 21, wherein the first film portion further includes a first film portion end, a direction from the first fixed end toward the first film portion end crosses the first fixed end direction, and the first film portion end is displaceable in the first element direction.

Configuration 23

The sensor according to Configuration 22, wherein a position of the first fixed end in a first cross direction is between a position of the first end portion in the first cross direction and a position of the first film portion end in the first cross direction, the first cross direction crossing a plane including the first end portion direction and the first element direction.

Configuration 24

The sensor according to Configuration 21, wherein the first film portion further includes a first film portion end and a first inner portion, a direction from the first fixed end toward the first film portion end crosses the first fixed end direction, the first inner portion is positioned between the first fixed end and the first film portion end in the direction from the first fixed end toward the first film portion end, and the first inner portion is displaceable in the first element direction.

Configuration 25

The sensor according to Configuration 24, further comprising a first film portion end sensing element fixed to the first film portion, a distance between the first film portion end sensing element and the first fixed end being longer than a distance between the first film portion end sensing element and the first film portion end, a distance between the first sensing element and the first fixed end being shorter than a distance between the first sensing element and the first film portion end, the first film portion end sensing element including a first film portion end magnetic layer, a first opposing film portion end magnetic layer provided between the first film portion end magnetic layer and the first film portion, and a first film portion end intermediate layer provided between the first film portion end magnetic layer and the first opposing film portion end magnetic layer.

Configuration 26

The sensor according to any one of Configurations 21 to 23, further comprising:

a second film portion supported by the supporter, the second film portion being deformable, the second film portion including a second fixed end extending along a second fixed end direction tilted with respect to the first end portion direction; and a second sensing element fixed to the second film portion, the second sensing element including a second magnetic layer, a second opposing magnetic layer provided between the second magnetic layer and the second film portion, and a second intermediate layer provided between the second magnetic layer and the second opposing magnetic layer.

Configuration 27

The sensor according to Configuration 26, wherein a direction from the first sensing element toward the second sensing element is aligned with the first end portion direction.

Configuration 28

The sensor according to Configuration 26 or 27, wherein a direction from the first fixed end toward the second fixed end is aligned with the first end portion direction.

Configuration 29

The sensor according to any one of Configurations 26 to 28, wherein a distance between the first sensing element and the first end portion along a direction perpendicular to a plane including the first end portion direction and the first element direction is not less than 0.8 times and not more than 1.2 times a distance between the second sensing element and the first end portion along the perpendicular direction.

Configuration 30

The sensor according to Configuration 26, wherein a direction from the first sensing element toward the second sensing element is aligned with a first fixed end cross direction crossing a plane including the first fixed end direction and the first element direction.

Configuration 31

The sensor according to Configuration 30, wherein a direction from the first fixed end toward the second fixed end is aligned with the first fixed end cross direction.

Configuration 32

The sensor according to any one of Configurations 26 to 31, wherein a length of the first film portion along a direction crossing a plane including the first fixed end direction and the first element direction is different from a length of the second film portion along a direction crossing a plane including the second fixed end direction and the first element direction.

Configuration 33

The sensor according to any one of Configurations 26 to 29, further comprising:

a third film portion supported by the supporter, the third film portion being deformable, the third film portion including a third fixed end extending along a third fixed end direction crossing the first end portion direction; and a third sensing element fixed to the third film portion, the third sensing element including a third magnetic layer, a third opposing magnetic layer provided between the third magnetic layer and the third film portion, and a third intermediate layer provided between the third magnetic layer and the third opposing magnetic layer, a direction from the first sensing element toward the third sensing element being aligned with a first fixed end cross direction crossing a plane including the first fixed end direction and the first element direction.

Configuration 34

The sensor according to Configuration 33, wherein a direction from the first fixed end toward the third fixed end is aligned with the first fixed end cross direction.

Configuration 35

The sensor according to Configuration 33 or 34, wherein a length of the first film portion along a direction crossing a plane including the first fixed end direction and the first element direction is different from a length of the third film portion along a direction crossing a plane including the third fixed end direction and the first element direction.

Configuration 36

The sensor according to any one of Configurations 21 to 35, further comprising a second magnetic portion, at least a portion of the first sensing element being positioned between the first magnetic portion and the second magnetic portion.

Configuration 37

The sensor according to any one of Configurations 21 to 36, wherein
  the first sensing element is multiply provided, and
  a position along the first fixed end direction of one of the multiple first sensing elements is different from a position along the first fixed end direction of another one of the multiple first sensing elements.

Configuration 38

The sensor according to Configuration 37, wherein the one of the multiple first sensing elements is electrically connected to the other one of the multiple first sensing elements.

Configuration 39

The sensor according to any one of Configurations 21 to 38, further comprising:
  a first member; and
  a second member,
  the supporter, the first film portion, and the first sensing element being positioned between the first member and the second member.

Configuration 40

An electronic device, comprising:
  the sensor according to any one of Configurations 21 to 39; and
  a housing.

According to the embodiments, a sensor and an electronic device can be provided in which the sensing characteristics can be stabilized.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in sensors such as film portions, sensing elements, magnetic layers, intermediate layers, conductive layers, processing parts, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensors, and electronic devices practicable by an appropriate design modification by one skilled in the art based on the sensors, and the electronic devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A sensor, comprising:
  a supporter;
  a first film portion supported by the supporter, the first film portion being deformable, the first film portion including a first fixed end extending along a first fixed end direction, the first fixed end direction lying in a first plane;
  a first sensing element fixed to the first film portion, the first sensing element including a first magnetic layer, a first opposing magnetic layer provided between the first magnetic layer and the first film portion, and a first intermediate layer provided between the first magnetic layer and the first opposing magnetic layer, a direction from the first opposing magnetic layer toward the first magnetic layer being aligned with a first element direction; and
  a first magnetic portion including a first end portion extending along a first end portion direction lying in a second plane parallel to the first plane and tilted with respect to the first fixed end direction, the first magnetic portion overlapping a portion of the supporter in the first element direction,
  wherein:
  a bias magnetic field generated from the first magnetic portion is perpendicular to the first end portion direction, and
  a direction of a strain generated according to a deformation of the first film portion is tilted with respect to the first end portion direction.

2. The sensor according to claim 1, wherein
  the first film portion further includes a first film portion end,
  a direction from the first fixed end toward the first film portion end crosses the first fixed end direction, and
  the first film portion end is displaceable in the first element direction.

3. The sensor according to claim 2, wherein a position of the first fixed end in a first cross direction is between a position of the first end portion in the first cross direction and a position of the first film portion end in the first cross direction, the first cross direction crossing a plane including the first end portion direction and the first element direction.

4. The sensor according to claim 1, wherein
the first film portion further includes a first film portion end and a first inner portion,
a direction from the first fixed end toward the first film portion end crosses the first fixed end direction,
the first inner portion is provided between the first fixed end and the first film portion end in the direction from the first fixed end toward the first film portion end, and
the first inner portion is displaceable in the first element direction.

5. The sensor according to claim 4, further comprising a first film portion end sensing element fixed to the first film portion,
a distance between the first film portion end sensing element and the first fixed end being longer than a distance between the first film portion end sensing element and the first film portion end,
a distance between the first sensing element and the first fixed end being shorter than a distance between the first sensing element and the first film portion end,
the first film portion end sensing element including a first film portion end magnetic layer, a first opposing film portion end magnetic layer provided between the first film portion end magnetic layer and the first film portion, and a first film portion end intermediate layer provided between the first film portion end magnetic layer and the first opposing film portion end magnetic layer.

6. The sensor according to claim 1, further comprising:
a second film portion supported by the supporter, the second film portion being deformable, the second film portion including a second fixed end extending along a second fixed end direction tilted with respect to the first end portion direction; and
a second sensing element fixed to the second film portion, the second sensing element including a second magnetic layer, a second opposing magnetic layer provided between the second magnetic layer and the second film portion, and a second intermediate layer provided between the second magnetic layer and the second opposing magnetic layer.

7. The sensor according to claim 6, wherein a direction from the first sensing element toward the second sensing element is aligned with the first end portion direction.

8. The sensor according to claim 6, wherein a direction from the first fixed end toward the second fixed end is aligned with the first end portion direction.

9. The sensor according to claim 6, wherein a distance between the first sensing element and the first end portion along a direction perpendicular to a plane including the first end portion direction and the first element direction is not less than 0.8 times and not more than 1.2 times a distance between the second sensing element and the first end portion along the perpendicular direction.

10. The sensor according to claim 6, wherein a direction from the first sensing element toward the second sensing element is aligned with a first fixed end cross direction crossing a plane including the first fixed end direction and the first element direction.

11. The sensor according to claim 10, wherein a direction from the first fixed end toward the second fixed end is aligned with the first fixed end cross direction.

12. The sensor according to claim 6, wherein a length of the first film portion along a direction crossing a plane including the first fixed end direction and the first element direction is different from a length of the second film portion along a direction crossing a plane including the second fixed end direction and the first element direction.

13. The sensor according to claim 6, further comprising:
a third film portion supported by the supporter, the third film portion being deformable, the third film portion including a third fixed end extending along a third fixed end direction crossing the first end portion direction; and
a third sensing element fixed to the third film portion, the third sensing element including a third magnetic layer, a third opposing magnetic layer provided between the third magnetic layer and the third film portion, and a third intermediate layer provided between the third magnetic layer and the third opposing magnetic layer,
a direction from the first sensing element toward the third sensing element being aligned with a first fixed end cross direction crossing a plane including the first fixed end direction and the first element direction.

14. The sensor according to claim 13, wherein a direction from the first fixed end toward the third fixed end is aligned with the first fixed end cross direction.

15. The sensor according to claim 13, wherein a length of the first film portion along a direction crossing a plane including the first fixed end direction and the first element direction is different from a length of the third film portion along a direction crossing a plane including the third fixed end direction and the first element direction.

16. The sensor according to claim 1, further comprising a second magnetic portion,
the second magnetic portion overlapping another portion of the supporter in the first element direction,
at least a portion of the first sensing element being provided between the first magnetic portion and the second magnetic portion.

17. The sensor according to claim 1, wherein
a plurality of the first sensing elements are provided, and
a position along the first fixed end direction of one of the first sensing elements is different from a position along the first fixed end direction of another one of the first sensing elements.

18. The sensor according to claim 17, wherein the one of the first sensing elements is electrically connected to the other one of the first sensing elements.

19. The sensor according to claim 1, further comprising:
a first member; and
a second member,
the supporter, the first film portion, and the first sensing element being provided between the first member and the second member.

20. An electronic device, comprising:
the sensor according to claim 1; and
a housing.

* * * * *